United States Patent
Yamazaki et al.

(10) Patent No.: US 7,053,969 B2
(45) Date of Patent: May 30, 2006

(54) LIQUID CRYSTAL DISPLAY DEVICE

(75) Inventors: Shunpei Yamazaki, Tokyo (JP); Shingo Eguchi, Tochigi (JP); Yutaka Shionoiri, Kanagawa (JP); Etsuko Fujimoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 91 days.

(21) Appl. No.: 10/374,999

(22) Filed: Feb. 28, 2003

(65) Prior Publication Data

US 2003/0164910 A1 Sep. 4, 2003

(30) Foreign Application Priority Data

Mar. 1, 2002 (JP) ............................ 2002-055830

(51) Int. Cl.
*G02F 1/136* (2006.01)

(52) U.S. Cl. ......................... 349/43; 257/59

(58) Field of Classification Search ............... 349/113, 349/114, 43, 147, 51; 257/59
See application file for complete search history.

(56) References Cited

U.S. PATENT DOCUMENTS

| | | | |
|---|---|---|---|
| 4,983,022 A * | 1/1991 | Shannon | ........................ 349/38 |
| 6,064,456 A | 5/2000 | Taniguchi et al. | |
| 6,097,459 A | 8/2000 | Shimada et al. | |
| 6,195,140 B1 | 2/2001 | Kubo et al. | |
| 6,392,735 B1 * | 5/2002 | Tani | ........................ 349/156 |
| 6,426,787 B1 | 7/2002 | Satake et al. | |
| 2003/0117552 A1 * | 6/2003 | Chae | ........................ 349/113 |
| 2004/0196419 A1 * | 10/2004 | Kanou et al. | ............... 349/113 |
| 2004/0218120 A1 * | 11/2004 | Ikeno et al. | ............... 349/113 |

FOREIGN PATENT DOCUMENTS

| | | |
|---|---|---|
| JP | 08-78329 | 3/1996 |
| JP | 11-101992 | 4/1999 |

* cited by examiner

*Primary Examiner*—Kenneth Parker
*Assistant Examiner*—David Chung
(74) *Attorney, Agent, or Firm*—Fish & Richardson P.C.

(57) ABSTRACT

It is an object to provide a display having high visibility and a transflective type liquid crystal display device having a reflection electrode having a concavo-convex structure formed without especially increasing the process. During manufacturing a transflective liquid crystal display device, a reflection electrode of a plurality of irregularly arranged island-like patterns and a transparent electrode of a transparent conductive film are layered in forming an electrode having transparent and reflection electrodes thereby having a concavo-convex form to enhance the scattering ability of light and hence the visibility of display. Furthermore, because the plurality of irregularly arranged island-like patterns can be formed simultaneous with an interconnection, a concavo-convex structure can be formed during the manufacturing process without especially increasing the patterning process only for forming a concavo-convex structure. It is accordingly possible to greatly reduce cost and improve productivity.

14 Claims, 15 Drawing Sheets

LIQUID CRYSTAL DISPLAY DEVICE

BACKGROUND OF THE INVENTION

1. Field of the Invention

The present invention relates to a liquid crystal display device of a passive matrix type and an active matrix type. Particularly, the invention relates to an electrode structure of a transflective type liquid crystal display device having both functions of a transmission type and a reflection type.

2. Description of the Related Art

In recent years, by explosive spread of a portable information terminal represented by a cellular phone, there is needed a display capable of dealing with light-weighted formation, low power consumption and a change in an environment of use.

Further, in views of thin film formation and light-weighted formation, a liquid crystal display device or an organic EL display device is representatively promising.

Power consumption of a transmission type display device is inconsiderable for driving only a display. However, a liquid crystal per se does not emit light and therefore, a back light is needed for displaying as a display. For use of a cellular phone, an EL back light is generally used, however, power is additionally needed for the back light and a specific characteristic of low power consumption of a liquid crystal is not fully utilized, which are disadvantageous in low power consumption. Further, although in a dark environment, display of a display is viewed with excellent contrast, in an ordinary bright environment, the display is not viewed so well and there is a drawback in adaptability in accordance with the environment of use both in cases of an upper emitting type and a lower emitting type.

Further, the organic EL display device is characterized in which a display element per se emits light. Although power consumption thereof becomes larger than that of a reflection type liquid crystal display device, the power consumption is smaller than that of a transmission type liquid crystal display device (having back light). However, similar to the case of the transmission type liquid crystal display device, although in a dark environment, display of a display is viewed excellently, in an ordinary bright environment, the display is not viewed so well and therefore, there is still a drawback in adaptability in accordance with an environment of use both in cases of the upper emitting type and the lower emitting type.

Further, the reflection type liquid crystal display device utilizes outside light from an environment as light for display. On the side of the display, the back light is not basically needed, only power for driving a liquid crystal and a drive circuit is needed and therefore, positive low power consumption is achieved. Further, quite contrary to the former two, although in a bright environment, display of a display is viewed excellently, in a dark environment, the display is not viewed so well. Considering the use of a portable information terminal, the portable information terminal is mainly used outdoors and there is frequently a case of viewing the display in a comparatively bright environment, however, this is still insufficient in terms of adaptability in accordance with an environment of use. Therefore, locally, a reflection type display device integrated with a front light is on sale such that the display can be carried out even in a dark environment.

Hence, attention is given to a transflective type liquid crystal display having advantages of both of a transmission type and a reflection type liquid crystal display device by combining the device. In a bright environment, a characteristic of the reflection type of low power consumption and excellence in visibility under the environment is utilized, meanwhile, in a dark environment, a characteristic of excellence in contrast provided to the transmission type is utilized by using a back light.

A transflective type liquid crystal display device is disclosed in JP-A-11-101992. The device is a reflection and transmission type (transflective type) liquid crystal display device. More concretely, by fabricating a reflection portion for reflecting outside light and a transmission portion for transmitting light from a back light in a single display pixel, in a case where the surrounding is totally dark, as a reflection and transmission type liquid crystal display device, the display is carried out by utilizing light transmitting through the transmission portion from the back light and light reflected by the reflection portion formed by a film having comparatively high reflectance, while in a case where the surrounding is bright, as a reflection type liquid crystal display device, the display is carried out by utilizing light reflected by the reflection portion formed by the film having the comparatively high optical reflectance.

Further, in the above-described transflective type liquid crystal display device, particularly at the reflection portion for carrying out reflection display, a special concavo-convex structure having optical diffusion is given. Since a reflection electrode, according to the structure thereof, reflects light from a certain direction by a certain incident angle only to a location having a specific exit angle in a specific direction (Snell's law) to the surface, when the surface is flat, a direction and an angle of emitting light are determined to be constant relative to incidence of light. If a display is fabricated under such a state, a display having very poor visibility is brought about.

The liquid crystal display device of a transflective type is considered as a display well coped with the particular service conditions for the personal digital assistant. Particularly, in the cellular phone application, huge demand is to be prospectively expected from now on. For this reason, in order to secure stable demand or cope with huge demand, there is an apparent need to make efforts toward the further reduction of cost.

However, in order to form a concavo-convex structure as noted before, there is a need for a method to provide a concavo-convex form in the layer lower than the reflection electrode and then form thereon a reflection electrode.

Meanwhile, in order to fabricate a transflective type liquid crystal display device without limited to the foregoing example, patterning is required for forming a concavo-convex structure in one or both surfaces of a reflection electrode and a transparent electrode configuring a pixel electrode or in the layer beneath the pixel electrode, thus increasing the processes. The increase of processes would incur a disadvantageous situation, including yield reduction, prolonged process time and increasing cost.

Accordingly, it is an object of the present invention to provide a display having high visibility and a transflective type liquid crystal display device having a reflection electrode with a concavo-convex structure formed without particularly increasing the processes.

SUMMARY OF THE INVENTION

In order to solve the foregoing problem, the present invention is characterized in that, in manufacturing a transflective liquid crystal display device, a reflection electrode of a plurality of irregularly arranged island-like patterns and a transparent electrode of transparent conductive film are layered in forming an electrode having transparent and reflection electrodes thereby providing a concavo-convex form and enhancing the scattering ability of light and hence display visibility. Furthermore, because the plurality of irregularly arranged island-like patterns can be formed simultaneous with the interconnection, a concavo-convex structure can be formed in the manufacturing process without especially increasing the patterning process only for forming a concavo-convex structure. Accordingly, it is possible to greatly reduce cost and improve productivity.

A liquid crystal display device of the invention is a liquid crystal display device comprising: a transparent conductive film formed on an insulating surface; and an interconnection and a plurality of irregularly arranged island-like patterns that are formed on the transparent conductive film; electrical connection being made between the transparent conductive film, the interconnection and the plurality of irregularly arranged island-like patterns.

The plurality of irregularly arranged island-like patterns serve as a reflection electrode. Also, by layering the transparent electrode of transparent conductive film and the reflection electrode of the plurality of irregularly arranged island-like patterns, the region having the reflection electrode serves as an electrode having a reflectivity to light. The region, not having a reflection electrode on the transparent electrode but exposed with the transparent electrode in the surface, serves as a transparent electrode having transmittability to light. Accordingly, in the invention, a transflective type liquid crystal display device is formed which has, as a pixel electrode, an electrode having two kinds of natures, i.e. reflectivity and transmittability. Namely, the pixel electrode of the invention comprises a reflection electrode and a transparent electrode, thus having a concavo-convex structure.

Meanwhile, the reflective conductive film of the invention assumably use a conductive film having a reflectivity of 75% or higher in respect of the vertical reflection characteristic in a wavelength of 400–800 nm (visible light region). Incidentally, such a material can use aluminum (Al) or silver (Ag), or, besides them, an alloy material based on these.

Also, a liquid crystal display device in another structure of the invention is a liquid crystal display device comprising: a thin-film transistor formed over a substrate; a transparent conductive film formed on the thin-film transistor through an insulating film; and an interconnection and a plurality of irregularly arranged island-like patterns that are formed on the transparent conductive film; the interconnection electrically connecting between the thin-film transistor and the transparent conductive film.

Furthermore, a liquid crystal display device of the invention is a liquid crystal display device characterized by: having a first substrate having a first transparent conductive film, an interconnection and a plurality of irregularly arranged island-like patterns, a second substrate having a second transparent conductive film and a liquid crystal; the interconnection and the plurality of irregularly arranged island-like patterns being formed on the first transparent conductive film; electrical connection being made between the transparent conductive film, the interconnection and the plurality of irregularly arranged island-like patterns; a film forming surface of the first substrate and a film forming surface of the second substrate being arranged opposite to each other, and the liquid crystal being sandwiched between the first substrate and the second substrate.

Furthermore, a liquid crystal display device of the invention is a liquid crystal display device characterized by: having a first substrate having a thin-film transistor, a first transparent conductive film, an interconnection and a plurality of irregularly arranged island-like patterns, a second substrate having a second transparent conductive film and a liquid crystal; the interconnection and the plurality of irregularly arranged island-like patterns being formed on the first transparent conductive film; the interconnection electrically connecting the thin-film transistor, the first transparent conductive film and the plurality of irregularly arranged island-like patterns; a film forming surface of the first substrate and a film forming surface of the second substrate being arranged opposite to each other, and the liquid crystal being sandwiched between the first substrate and the second substrate.

Incidentally, according to each of the above structures, it is possible to form, by etching, the plurality of irregularly arranged island-like patterns of a reflective conductive film and the interconnection. Furthermore, in the case of simultaneously forming them by etching, because a concavo-convex structure can be configured as viewed at a film-forming surface of the reflective conductive film, it is possible to reduce the photolithography process used in usually forming a concavo-convex structure. This can realize great cost reduction and improvement in productivity.

Meanwhile, the plurality of irregularly arranged island-like patterns to be formed in each of the above structures are formed and arranged in a random form, and electrically connected to the first transparent conductive film. However, the island-like pattern formed by etching the reflective conductive film is desirably given a smaller taper angle at a pattern end in view of improving the ability of reflection. Incidentally, the plurality of island-like patterns of the invention is characterized by a taper angle of 5–60 degrees at each pattern end.

Furthermore, in each of the above structures, the plurality of island-like patterns of reflective conductive film formed in the pixel region is characterized to have a occupation area ratio of 50–90% of the area of the pixel region.

DESCRIPTION OF THE PREFERRED EMBODIMENTS

Figure 1:
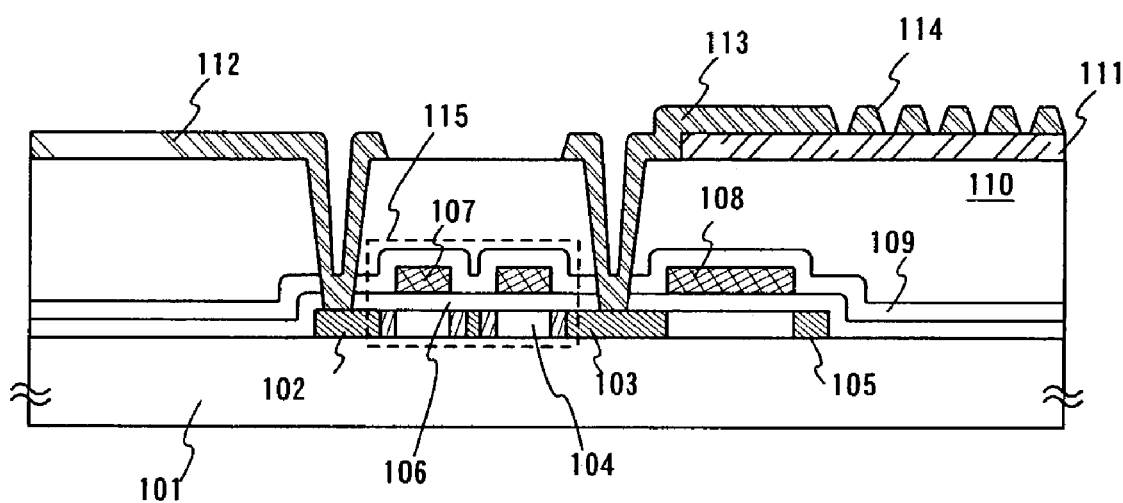
FIG. 1 is a view explaining a device structure of a liquid crystal display device of the present invention.

An embodiment of the present invention will now be explained with reference to FIG. 1. A semiconductor layer 105 is formed over a substrate 101. The semiconductor layer 105 is formed, of polycrystal semiconductor that an amorphous semiconductor has been crystallized by a thermal process, having a thickness of approximately 30–750 nm, on which a gate insulating film 106 is formed furthermore. The gate insulating film 106 is formed of silicon oxide having 30–100 nm. Also, although the polycrystal semiconductor is used as the semiconductor layer 105, an amorphous semiconductor also can be used as the semiconductor layer 105.

A gate electrode 107 and a capacitance interconnection 108 are formed in a same layer on the gate insulating film 106, on which a first insulating film 109 of silicon oxide and a second insulating film 110 of acryl are formed. The material for forming a first insulating film 109 can use, besides silicon oxide, a silicon-contained inorganic material, such as silicon nitride, silicon nitride oxide or applied silicon oxide (SOG: Spin On Glass). The material for forming a second insulating film 110 can use, besides acryl (including photosensitive acryl), an organic material, such as polyimide, polyamide, BCB (benzocyclo-butene).

A transparent electrode 111 is an electrode for allowing incident light to transmit toward the substrate 101. The transparent electrode 111 is formed in a film thickness of 100–200 nm by using, as a material, a transparent conductive film of indium oxide-tin (ITO) or indium oxide mixed with zinc oxide (ZnO) in 2–20[%]. This is further patterned to form transparent electrodes 111 on a pixel-by-pixel basis.

An interconnection 112 is an electrode forming a contact to a source region 102 of a TFT 115, also serving as a source line. The interconnection 113 is an electrode forming a contact to a drain region of the TFT 115.

The semiconductor layer 105 is formed with a source region 102, a drain region 103 and a channel region 104. Except the source region 102 and drain region 103, the semiconductor layer 105 formed in a region overlapped with a capacitance interconnection 108 serves as one electrode of a capacitance element.

Meanwhile, on the transparent electrode 111 formed before, a reflection electrode 114 is formed by a reflection conductive film in the same film as the conductive film forming the interconnections 112, 113. Namely, a photolithography technique is used to form a plurality of island-like patterns on the transparent electrode 111 in the pixel region. In the region other than those, interconnections 112, 113 are formed. The island-like patterns herein are in a random form and arrangement forming the reflecting electrode 114. The reflection electrode 114 thus structured can possess a function to scatter the incident light on the surface.

According to the structure of the invention, the light, incident on the reflection electrode 114 formed on the transparent electrode 111, is cause to scatter by the form of the reflection electrode 114. However, the light incident on a region, exposed with the transparent electrode 222 instead of forming the reflection electrode 114, transmits through the transparent electrode 111 and exits toward the substrate 101.

Figure 2A:
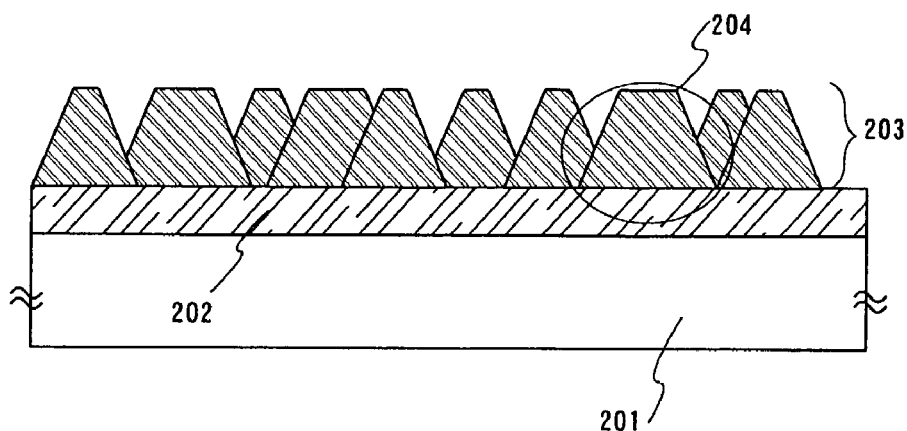
FIGS. 2A to 2D are views explaining a structure of a reflection electrode of the invention.

The reflection electrode formed in the invention, formed in a random form and region as shown in its form in FIG. 2A, can cause deviation between the angle of an incident light on the reflection electrode (incident angle) and the angle of a light reflected upon the reflection electrode (reflection angle) thereby scattering the light.

Figure 2B:
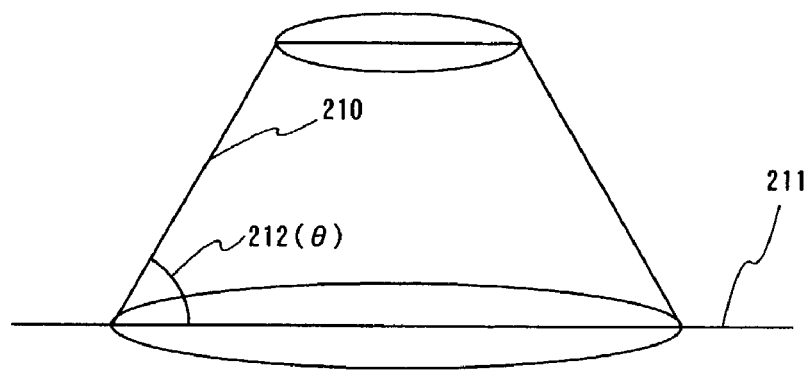

Incidentally, in the invention, importance is placed on the form of a plurality of reflectors configuring the reflection electrode in respect of causing deviation between the incident angle and the reflection angle, i.e. an angle representative of in what degree the taper slope surface (reflection surface) 210 of each reflector shown in FIG. 2B inclines with respect to a substrate surface (reference surface) 211. This is shown as a taper angle ($\theta$) 212.

In this embodiment, the reflectors are formed with a taper angle ($\theta$) 212 of 5–60 degrees. Due to this, the exit angle with respect to the taper slope surface (reflection surface) 211 is deviated as compared to the exit angle with respect to the substrate surface (reference surface) 210 to cause light scattering. This makes it possible to improve visibility.

Figure 2C:
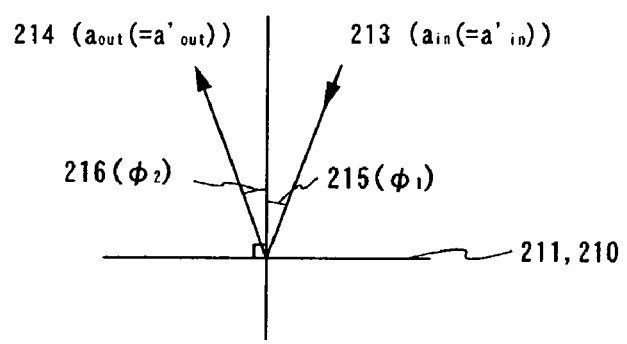

FIG. 2C shows a behavior of incident light 213 and reflection light 214 upon a reflection surface not sloped. It is assumed that an incident direction on the reference surface 211 is $a_{in}$, an exit direction is $a_{out}$, an incident direction on the reflection surface 210 is $a'_{in}$, and an exit direction is $a'_{out}$. Furthermore, an incident angle ($\phi_1$)) 215 and an exit angle ($\phi_2$) 216 are defined with respect to the reference surface. Herein, since there is coincidence between the reference surface 211 and the reflection surface 210, $a_{in}=a'_{in}=\phi_1$ and $a_{out}=a'_{out}=\phi_2$ are held.

Also, from $a'_{in}=a'_{out}$ held on the Snell's law, $a_{in}=a_{out}$ and $\phi_1=\phi_2$ are held.

Figure 2D:
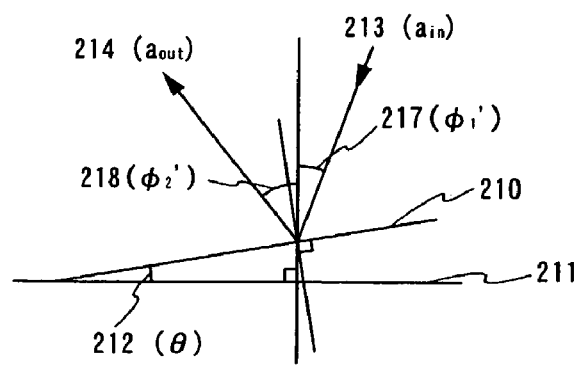

On the other hand, FIG. 2D shows a behavior of incident light 213 and exit light 214 in the case the taper slope surface having a taper angle ($\theta$) 212 is made as a reflection surface.

Provided that the incident light 213 and the exit light 214 are respectively an incident angle ($\phi_1$') 217 and an exit angle ($\phi_2$') 218 with respect to the reference surface 211, then $a_{in}=\phi_1$' and $a_{out}=\phi_2$' and further $a'_{in}=\phi_1$'$-\theta$ and $a'_{out}=\phi_2$'$-\theta$ are held.

Meanwhile, because $a'_{in}=a'_{out}$ is held on the Snell's law, $\phi_1$'$+\theta=\phi_2$'$-\theta$ is held. From this equation, the relationship between an incident angle ($\phi_1$') 217 and an exit angle ($\phi_2$') 218 can be expressed by $\phi_2$'$-\phi_1$'$=2\theta$. This means that there is a deviation by $2\theta$ between the incident direction ($a_{in}$) of incident light 213 and the exit direction ($a_{out}$) of exit light 214.

In order to fabricate a panel further excellent in visibility, it is preferred to evenly distribute the relevant deviation angle ($2\theta$) within a range of 40 degrees or smaller. Consequently, the reflectors 204 are further, preferably formed to provide a taper angle ($\theta$) 212 of 20 degrees or smaller.

In this embodiment, by forming the reflectors 204 structuring a reflection electrode 114 with a taper angle ($\theta$) 212 of 5–60 degrees, the light incident on the reflection electrode 114 can be scattered efficiently. Accordingly, the structure of the invention makes it possible to enhance display visibility without increasing the manufacture processes for TFTs.

Incidentally, a transflective type liquid crystal display device can be formed by mating a counter substrate (not shown) having a counter electrode on a device substrate (FIG. 1) having TFTs on the substrate explained in the embodiment and then providing a liquid crystal between the both.

EXAMPLES

Examples of the invention will be explained as follows.

Example 1

According to the example, an example of steps of fabricating an active matrix substrate having a top gate type TFT will be shown. Further, FIG. 3A through FIG. 7 showing top views and sectional views of a portion of a pixel portion will be used for explanation.

First, an amorphous semiconductor layer is formed over a substrate 301 having an insulating surface. Here, a quartz substrate is used as the substrate 301 and the amorphous semiconductor layer is formed with a thickness of 10 through 100 nm.

Further, a glass substrate or a plastic substrate can be used other than the quartz substrate. When the glass substrate is used, the glass substrate may be subjected to a heat treatment previously at a temperature lower than a glass strain point by about 10 through 20° C. Further, a base film comprising an insulating film such as a silicon oxide film, a silicon nitride film, a silicon oxynitride film and the like may be formed on a surface of the substrate 301 for forming TFT to prevent an impurity from diffusing from the substrate 301.

As the amorphous semiconductor layer, an amorphous silicon film (amorphous silicon film) having a film thickness of 60 nm is formed by LPCVD method. Successively, the amorphous semiconductor layer is crystallized. Here, the amorphous semiconductor layer is crystallized by using a technology described in JP-A-8-78329. According to the technology described in the publication, an amorphous silicon film is selectively added with a metal element to help the crystallization of the amorphous silicon film and a heating treatment is carried out to thereby form a crystalline silicon film spreading with an addition region as a start point. Here, nickel is used as a metal element for helping the crystallization and after a heat treatment for dehydrogenation (450° C., 1 hour), a heat treatment for crystallization (600° C., 12 hours) is carried out. Further, although the technology described in the publication is used here for the crystallization, the invention is not particularly limited to the technology but a publicly known crystallizing processing (laser crystallizing method, thermal crystallizing method) can be used.

Further, as necessary, a laser beam (XeCl: wavelength 308 nm) is irradiated in order to increase a crystallization rate and repairing a defect that remains in a crystal grain. As the laser beam, an excimer laser beam, or a second harmonic or third harmonic of YAG laser having a wavelength equal to or smaller than 400 nm is used. At any rate, a pulse laser beam having a repeating frequency of about 10 through 1000 Hz may be used and the laser beam may be focused to 100 through 400 mJ/cm$^2$ by an optical system, irradiated by 90 through 95% of an overlap rate and scanned on a surface of a silicon film.

Successively, Ni is gettered from a region constituting an active layer of TFT. Here, as a gettering method, an example of using a semiconductor layer including a rare gas element will be shown. In addition to an oxide film formed by irradiating the laser beam, a barrier layer comprising an oxide film of a total of 1 through 5 nm is formed by processing a surface for 120 seconds by ozone water. Successively, an amorphous silicon film including argon element constituting a gettering site is formed on the barrier layer by a sputtering method with a film thickness of 150 nm. According to film forming conditions by the sputtering method of the example, film forming pressure is set to 0.3 Pa, a flow rate of gas (Ar) is set to 50 (sccm), film forming power is set to 3 kW and substrate temperature is set to 150° C. Further, atomic concentration of argon element included in the amorphous silicon film falls in a range of $3\times10^{20}/cm^3$ through $6\times10^{20}/cm^3$ and atomic concentration of oxygen falls in a range of $1\times10^{19}/cm^3$ through $3\times10^{19}/cm^3$ under the above-described conditions. Thereafter, gettering is carried out by a heat treatment at 650° C. for 3 minutes by using a lamp annealing device. Further, an electric furnace may be used in place of the lamp annealing device.

Successively, by constituting an etching stopper by the barrier layer, the amorphous silicon film including argon element constituting the gettering side is selectively removed and thereafter, the barrier layer is selectively removed by diluted hydrofluoric acid. Further, in gettering, since nickel tends to move to a region having a high oxygen concentration, a barrier layer comprising an oxide film may preferably be removed after gettering.

After forming a thin oxide film on a surface of a silicon film (also referred to as polysilicon film) having the provided crystalline structure by ozone water, a mask comprising a resist is formed, the silicon film is etched to a desired shape and a semiconductor layer 305 separated in an island-like shape is formed. After forming the semiconductor layer 305, the mask comprising the resist is removed, a gate insulating film 306 covering the semiconductor layer 305 is formed with a film thickness of 100 nm and thereafter, thermal oxidation is carried out.

Successively, a channel doping step of adding a P-type or an N-type impurity element to a region for constituting a channel region of TFT at a low concentration is carried out over an entire face thereof or selectively. The channel doping step is a step of controlling threshold voltage of TFT. Further, as an impurity element for providing P-type to a semiconductor, elements of 13-th group of the periodic law such as boron (B), aluminum (Al) or gallium (Ga) are known. Further, as impurity elements for providing n-type to a semiconductor, elements belonging to 15-th group of the periodic law, typically, phosphor (P) and arsenic (As) are known. Further, here, boron is added by a plasma-exciting ion doping method without subjecting dibolane ($B_2H_6$) to mass separation. Naturally, an ion implantation method for carrying out mass separation may be used.

Successively, a first conductive film is formed and patterned to thereby form a gate electrode 307 and a capacitance interconnection 308. A laminated structure of tantalum nitride (TaN) (film thickness 30 nm) and tungsten (film thickness 370 nm) is used. Here, a double gate structure is constituted in the example. Further, holding capacitance is constituted by the capacitance interconnection 308 and a region a (303a) constituting a portion of the semiconductor layer 305 with the gate insulating film 306 being as a dielectric.

Then, phosphorus is added at low concentration through the gate electrode 307 and capacitance interconnection 308 as a mask in a self-aligned manner. In the region added at low concentration, phosphorus concentration is controlled to $1\times10^{16}$–$5\times10^{18}/cm^3$, typically $3\times10^{17}$–$3\times10^{18}/cm^3$.

Next, a mask (not shown) is formed to add phosphorus at high concentration to form a high-concentration impurity region to be made into a source region 302 or drain region 303. In this high-concentration impurity region, phosphorus concentration is controlled to $1\times10^{20}$–$1\times10^{21}/cm^3$ (typically $2\times10^{20}$–$5\times10^{20}/cm^3$). The semiconductor layer 305, in a region overlapped with the gate electrode 307, is formed into a channel region 304. The region covered by the mask is formed into a low-concentration impurity region and into an LDD region 311. Furthermore, a region not covered by any of the gate electrode 307, the capacitance line 308 and the mask is made as a high-concentration impurity region including a source region 302 and a drain region 303.

Further, according to the example, TFTs of the pixel portion and TFTs of a drive circuit are formed on the same substrate and in the TFTs of the drive circuit, a low concentration impurity region having an impurity concentration lower than those of source and drain regions may be provided between a source and a drain region on both sides of a channel formation region or the low concentration impurity region may be provided on one side thereof. However, it is not always necessarily to provide the low concentration impurity region on the both sides, a person carrying out the example may design a mask appropriately.

In addition, although not illustrated here, because this example forms p-channel TFTs to be used for a drive circuit formed on the same substrate as the pixels, the region to be formed into n-channel TFTs is covered by a mask to add boron thereby forming a source or drain region.

Figure 3A:
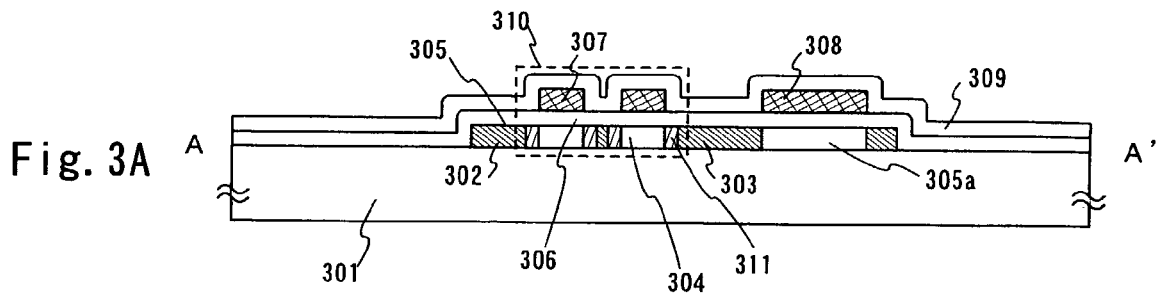
FIGS. 3A to 3D are views showing a manufacturing process for a liquid crystal display device of the invention.
Figure 4:
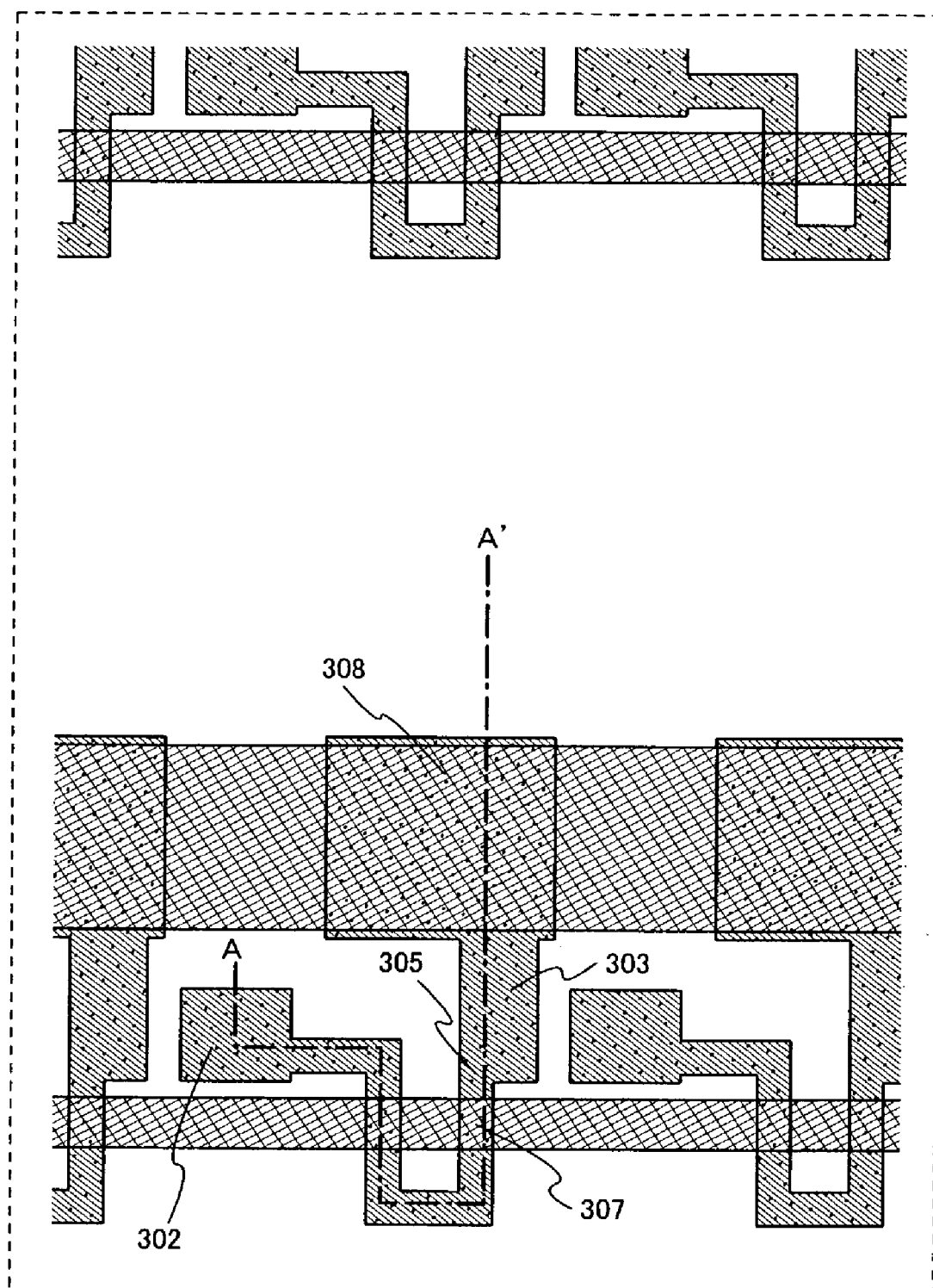
FIG. 4 is a view showing the manufacturing process for a liquid crystal display device of the invention.

Then, after removing the mask, a first insulating film 309 is formed covering the gate electrode 307, the capacitance interconnection 308. Herein, a silicon oxide film is formed in a film thickness of 50 nm, and a thermal process is carried out to activate the n-type or p-type impurity element added at respective concentrations in the semiconductor layer 305. Herein, thermal process is made at 850° C. for 30 minutes (FIG. 3A). Incidentally, a pixel top view herein is shown in FIG. 4. In FIG. 4, the sectional view taken along the dotted line A-A' corresponds to FIG. 3A.

Figure 3B:
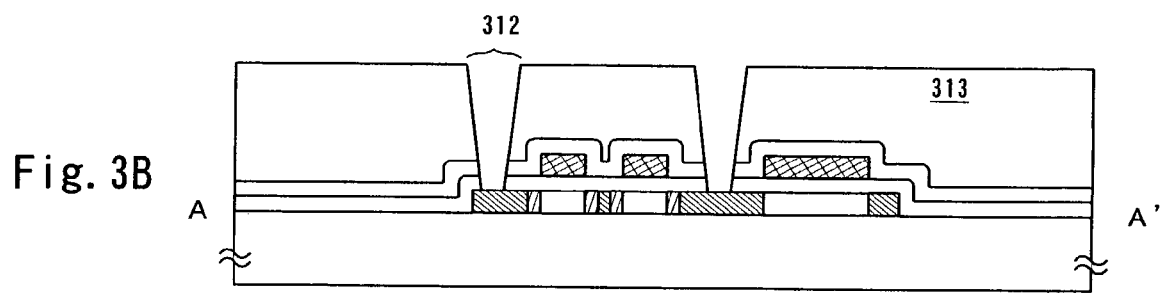
Figure 5:
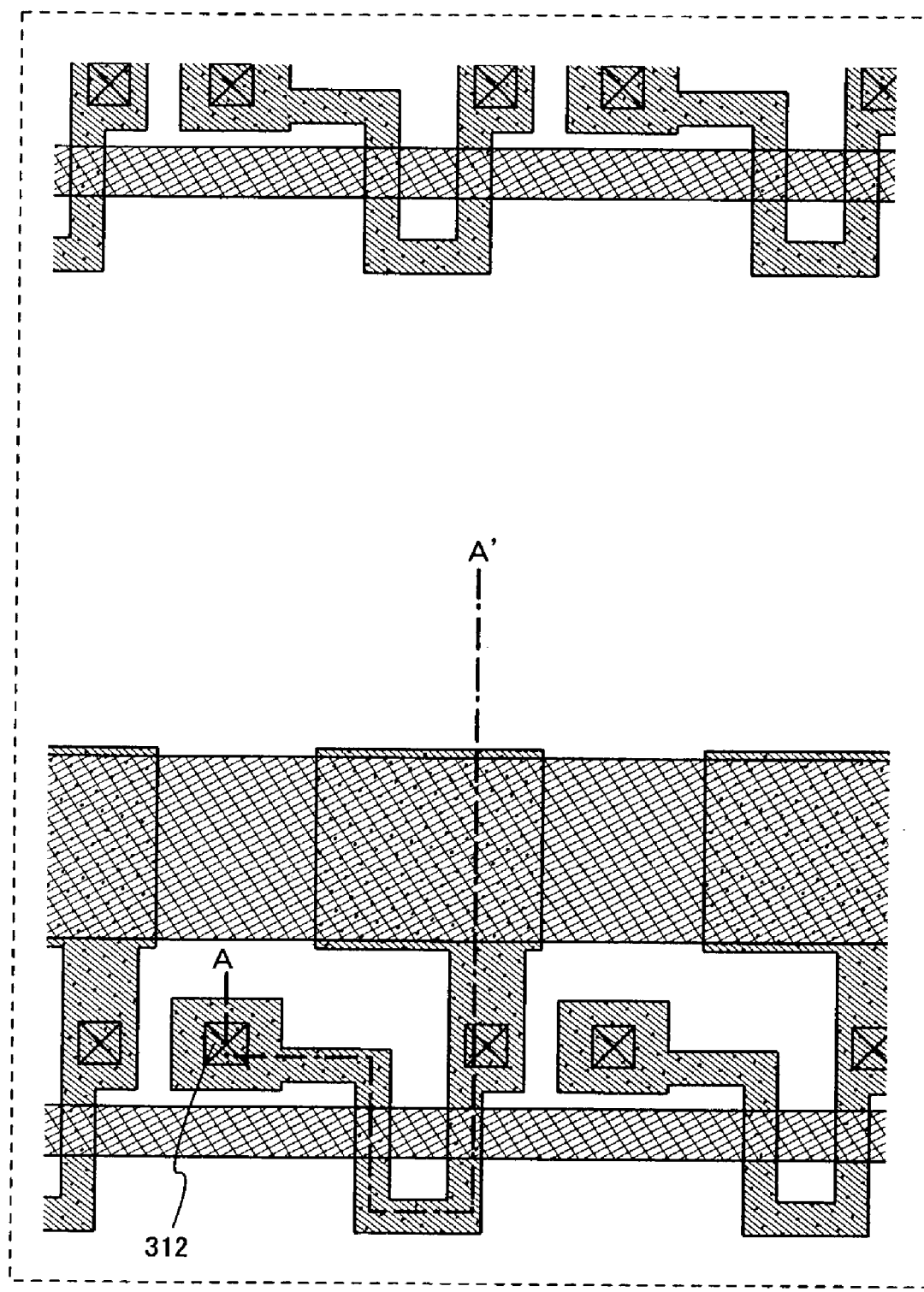
FIG. 5 is a view showing the manufacturing process for a liquid crystal display device of the invention.

Then, after carrying out a hydrogenation process, a second insulating film 313 is formed of an organic resin material. By herein using an acryl film having a film thickness of 1 µm, the second insulating film 313 can be flattened in its surface. This prevents the affection of a step caused by the pattern formed in the layer beneath the second insulating film 313. Then, a mask is formed on the second insulating film 313, to form by etching a contact hole 312 reaching the semiconductor layer 305 (FIG. 3B). After forming the contact hole 312, the mask is removed away. Further, FIG. 5 shows a top view of the pixel in this case. In FIG. 5, a sectional view taken along the dotted line A–A' corresponds to FIG. 3B.

Figure 3C:
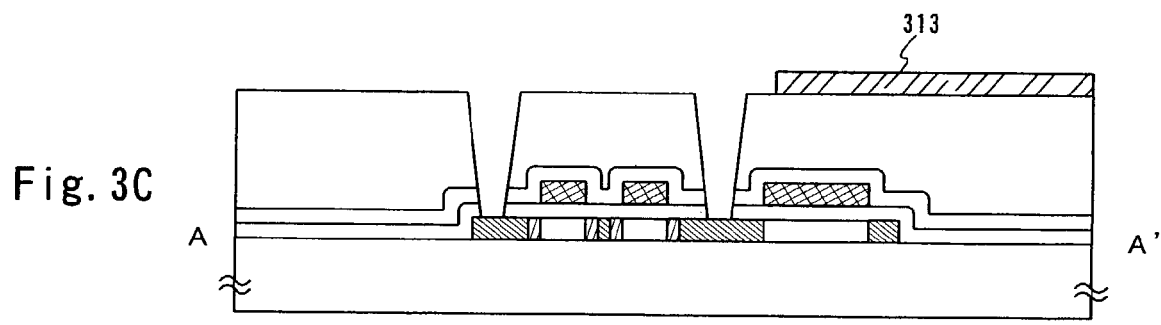
Figure 6:
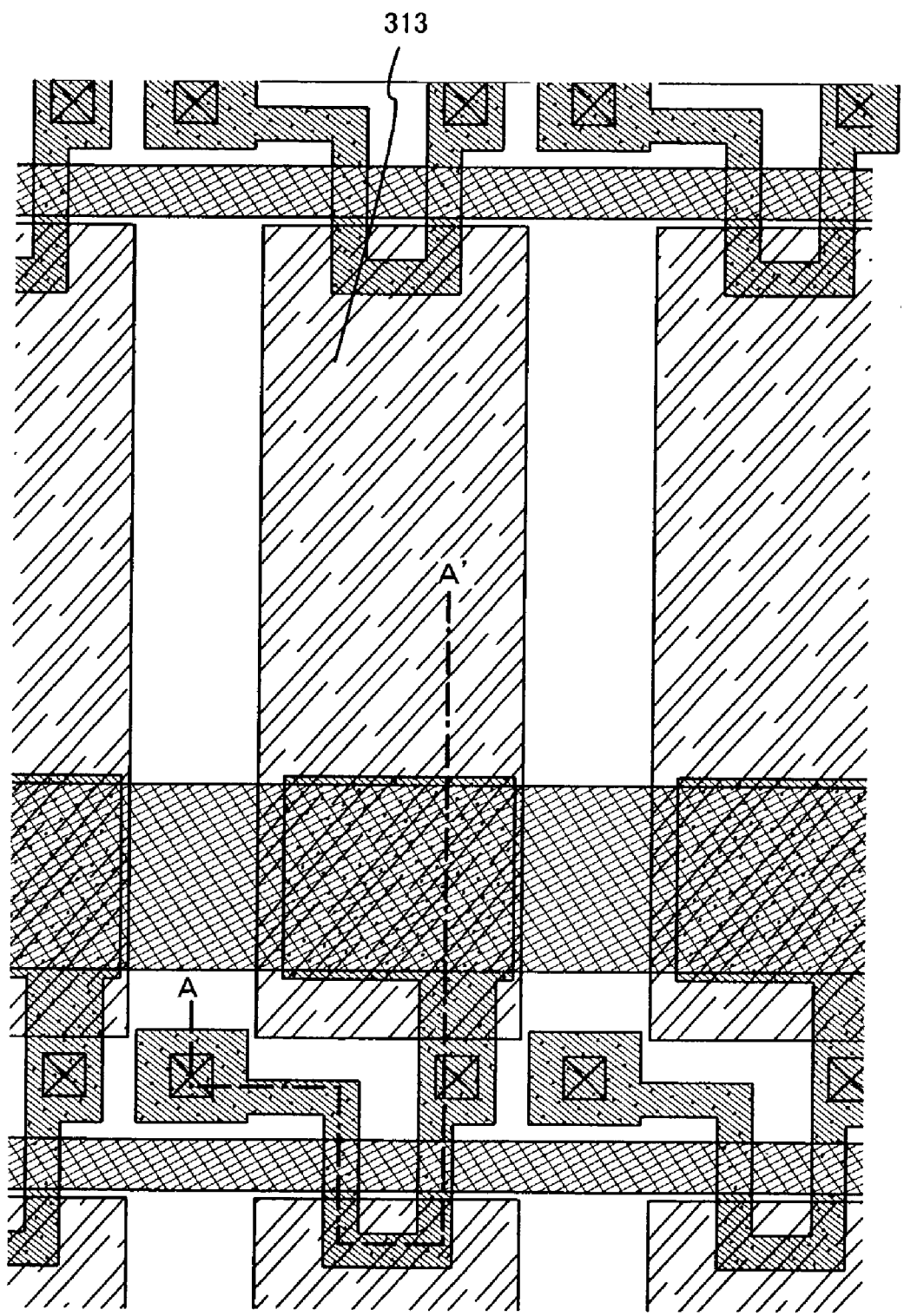
FIG. 6 is a view showing the manufacturing process for a liquid crystal display device of the invention.

Next, a 120-nm transparent conductive film (herein, indium oxide-tin (ITO) film) is deposited by sputtering, and patterned into a rectangular form by the use of a photolithography technique. After carrying out a wet-etching treatment, a heating treatment is made in a clean oven at 250° C. for 60 minutes thereby forming a transparent electrode 313 (FIG. 3C). The pixel top view herein is shown in FIG. 6. In FIG. 6, the sectional view taken along the dotted line A-A' corresponds to FIG. 3C.

Next, a second conductive film is formed and patterned. Due to this, formed are, besides a reflection electrode 314 formed on the transparent electrode 313, an interconnection 315 which is also a source line and an intersection 316 electrically connecting between a TFT 310 and the transparent electrode 313 are formed. Note that the second conductive film formed herein is a reflective conductive film to form a reflection electrode of the invention, which can use aluminum or silver, or otherwise an alloy material based on these.

This example uses a layered film having a two-layer structure continuously formed, by a sputter method, with a Ti film having 50 nm as the second conductive film and an Si-contained aluminum film having 500 nm.

The method of patterning uses a photolithography technique to form a reflection electrode 314 comprising a plurality of island-like patterns and interconnections 315, 316. The method for etching herein uses a dry etching scheme to carry out taper etching and anisotropic etching.

At first, a resist mask is formed to carry out a first etching process for taper etching. The first etching process is under first and second etching conditions. For etching, an ICP (Inductively Coupled Plasma) etching technique is suitably used. Using the ICP etching technique, the film can be etched to a desired taper form by properly controlling the etching condition (amount of power applied to a coil-formed electrode, amount of power applied to a substrate-sided electrode, electrode temperature close to the substrate, etc.). The etching gas can suitably use a chlorine-based gas represented by $Cl_2$, $BCl_3$, $SiCl_4$, $CCl_4$ or the like, a fluorine-based gas represented by $CF_4$, $SF_6$, $NF_3$ or the like, or $O_2$.

This example uses the ICP (Inductively Coupled Plasma) etching technique, as a first etching condition, wherein $BCl_3$, $Cl_2$ and $O_2$ are used for an etching gas. Etching is conducted with plasma caused by feeding a 500 W RF (13.56 MHz) power to a coil-formed electrode at a flow rate ratio of these gasses of 65/10/5 (sccm) under a pressure of 1.2 Pa. A 300 W RF (13.56 MHz) power is fed also to the substrate side (sample stage) to apply substantially a negative self-bias voltage. Under the first etching condition, the Si-contained aluminum film is etched to make the first conductive layer at its end into a taper form.

Thereafter, the second etching condition is changed without removing the mask. Using $CF_4$, $Cl_2$ and $O_2$ for an etching gas, etching is conducted for nearly 30 seconds with plasma caused by feeding a 500 W RF (13.56 MHz) power to the coil-formed electrode at a flow rate ratio of these gasses of 25/25/10 (sccm) under a pressure of 1 Pa. A 20 W RF (13.56 MHz) power is fed also to the substrate side (sample stage) to apply substantially a negative self-bias voltage. Under the second etching condition having $CF_4$ and $Cl_2$ mixed together, the Si-contained aluminum film and the Ti film are both etched in the same degree.

In this manner, by the first etching process, the second conductive film comprising the first and second conductive layers can be made into a taper form.

Then, a second etching process for anisotropic etching is carried out without removing the resist mask. Using herein $BCl_3$ and $Cl_2$ for an etching gas, etching is conducted with plasma caused by feeding a 300 W RF (13.56 MHz) power to the coil-formed electrode at a flow rate ratio of these gasses of 80/20 (sccm) under a pressure of 1 Pa. A 50 W RF (13.56 MHz) power is fed also to the substrate side (sample stage) to apply substantially a negative self-bias voltage.

Figure 3D:
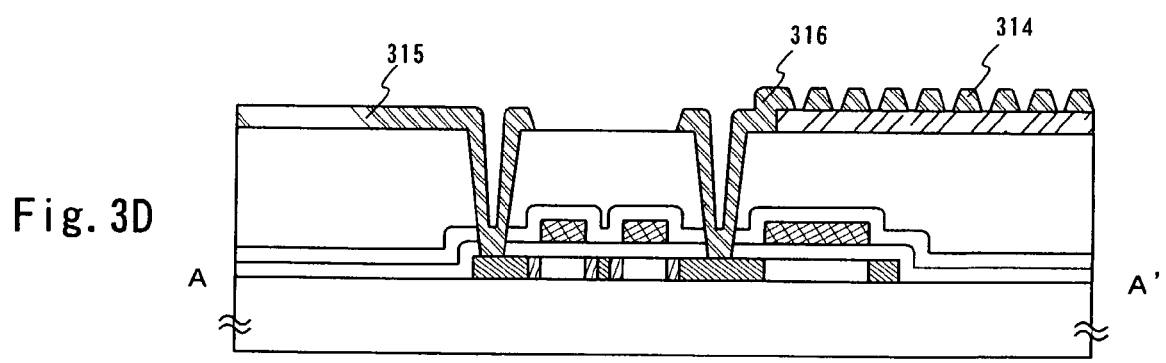
Figure 7:
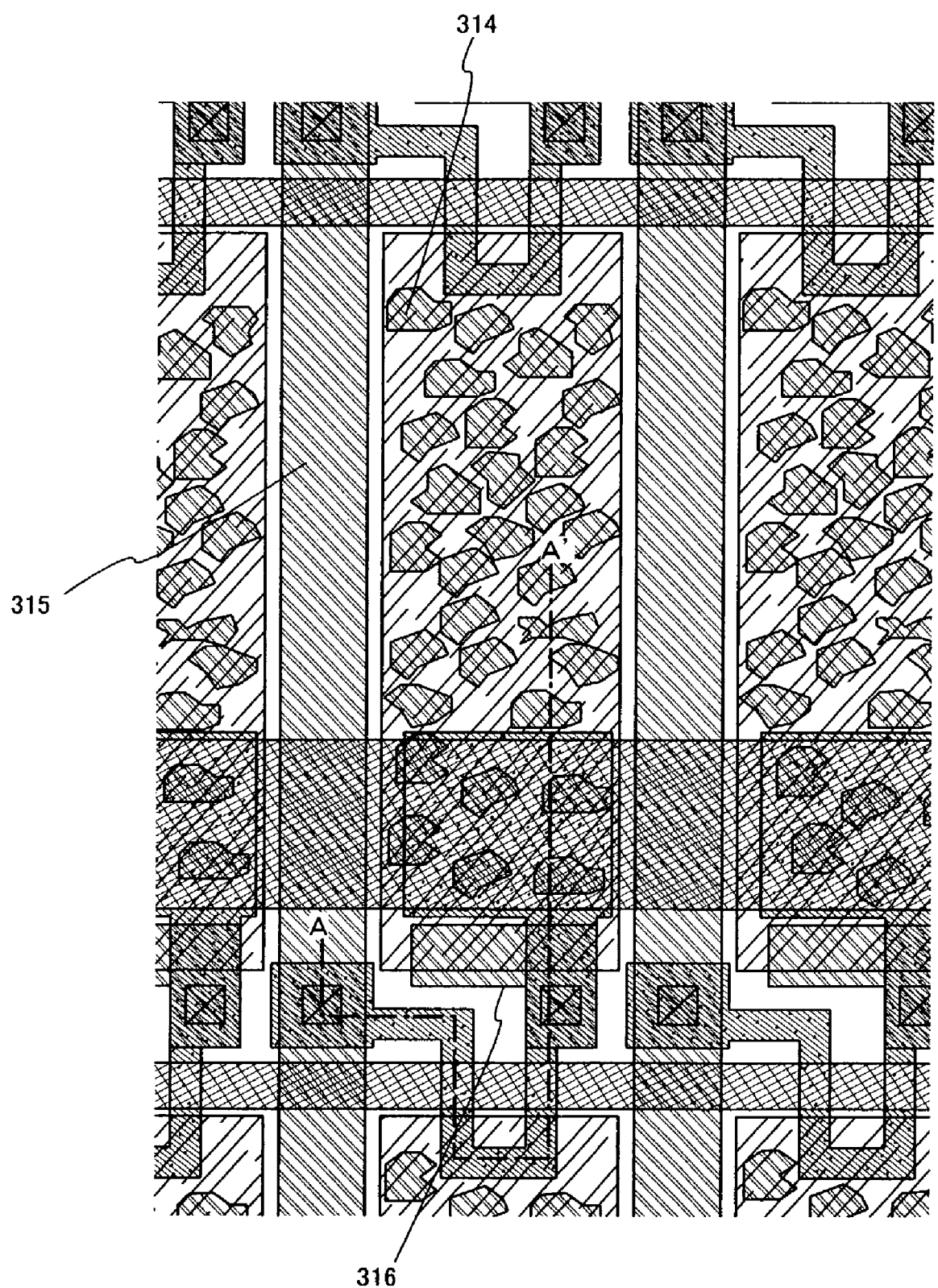
FIG. 7 is a view showing the manufacturing process for a liquid crystal display device of the invention.

By the above, at a time that a reflection electrode 314 and interconnections 315 and 316 are formed, the resist is removed to obtain a structure shown in FIG. 3D. Incidentally, a pixel top view herein is shown in FIG. 7. In FIG. 7, the sectional view taken along the dotted line A–A' corresponds to FIG. 3D.

Further, by randomly forming the reflecting electrode 314 above the transparent electrode 313 as shown in FIG. 7, at portions of the transparent electrode 313 and the reflecting electrode 314 formed to overlap, light is reflected by the reflecting electrode 314 and at a portion at which the reflecting electrode 314 is not formed and the transparent electrode 313 is exposed to the surface, light transmits through an inner portion of the transparent electrode 313 and is emitted to a side of the substrate 301.

In this way, the pixel portion having the n-channel type TFT having the double gate structure and the holding capacitance and the drive circuit having the n-channel type TFT and the p-channel type TFT can be formed on the same substrate. In the specification, such a substrate is referred to as an active matrix substrate for convenience.

Further, the example is only an example, needless to say the invention is not limited to steps of the example. For example, as respective conductive films, a film of an element selected from the group constituting of tantalum (Ta), titanium (Ti), molybdenum (Mo), tungsten (W), chromium (Cr) and silicon (Si) or an alloy combined with the elements (representatively, Mo—W alloy, Mo—Ta alloy) can be used. Further, as the respective insulating films, a silicon oxide film, a silicon nitride film, a silicon oxynitride film, a film of an organic resin material (polyimide, acrylic resin, polyamide, polyimideamide, BCB (benzocyclobutene) etc) can be used.

Meanwhile, according to the process shown in this example, it is possible to simultaneously form a reflection electrode 314 and interconnections 315 and 316 by using an interconnection pattern mask as shown in FIG. 3D. Consequently, the reflection electrode can be formed separately in plurality in an island form on a transparent electrode without increasing the number of photo-masks required in fabricating an active matrix substrate. As a result, in the manufacture of a transflective type liquid crystal display device, the process can be shortened thereby giving contribution to manufacture cost reduction and yield improvement.

Example 2

This example concretely explains a method for manufacturing a transflective type liquid crystal display device different in structure from Example 1.

Figure 8A:
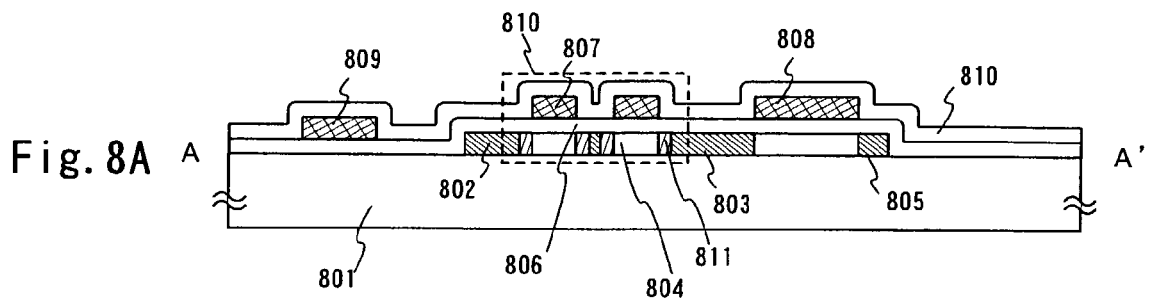
FIGS. 8A to 8D are views showing the manufacturing process for a liquid crystal display device of the invention.

At first, an amorphous semiconductor film is formed over a substrate 801 as shown in FIG. 8A. After crystallizing this, a semiconductor layer 805 is formed which is separated in an island form by patterning. Furthermore, on the semiconductor layer 805, a gate insulating film 806 is formed by an insulating film. Incidentally, the manufacturing method of up to forming a gate insulating film 806 is similar to that shown in Example 1, and hence reference may be made to Example 1. Similarly, after forming an insulating film covering the semiconductor layer 805, thermal oxidation is carried out to form a gate insulating film 806.

Then, a channel dope process is carried out over the entire surface or selectively, to add a p-type or n-type impurity element at low concentration to a region to be made into a TFT channel region.

A conductive film is formed on the gate insulating film 806. By patterning this, an interconnection 809 can be formed that is to be made into a gate electrode 807, a capacitance interconnection 808 and a source line. Incidentally, the first conductive film in this example is formed by layering TaN (tantalum nitride) formed in a thickness of 50–100 nm and W (tungsten) formed in a thickness of 100–400 nm.

Although this example formed the conductive film by the use of the layers of TaN and W, they are not especially limited, i.e. both may be formed of an element selected from Ta, W, Ti, Mo, Al and Cu or an alloy or compound material based on the element. Otherwise, a semiconductor film may be used that is represented by a polycrystal silicon film doped with an impurity element, such as phosphorus.

Then, phosphorus is added at low concentration through the gate electrode 807 and capacitance interconnection 808 as a mask in a self-aligned fashion. In the region added at low concentration, phosphorus concentration is controlled to $1\times10^{16}$–$5\times10^{18}$/cm$^3$, typically $3\times10^{17}$–$3\times10^{18}$/cm$^3$.

Next, a mask (not shown) is formed to add phosphorus at high concentration to form a high-concentration impurity region to be made into a source region 802 or drain region 803. In this high-concentration impurity region, phosphorus concentration is controlled to $1\times10^{20}$–$1\times10^{21}$/cm$^3$ (typically $2\times10^{20}$–$5\times10^{20}$/cm$^3$). The semiconductor layer 805, in a region overlapped with the gate electrode 807, is formed into a channel region 804. The region covered by the mask is formed into a low-concentration impurity region and into an LDD region 811. Furthermore, the region not covered by any of the gate electrode 807, the capacitance line 808 and the mask is made as a high-concentration impurity region including a source region 802 and a drain region 803.

Meanwhile, because this example forms p-channel TFTs to be used for a drive circuit formed on the same substrate as the pixels similarly to Example 1, the region to be formed into n-channel TFTs is covered by a mask to add boron thereby forming a source or drain region.

Figure 9:
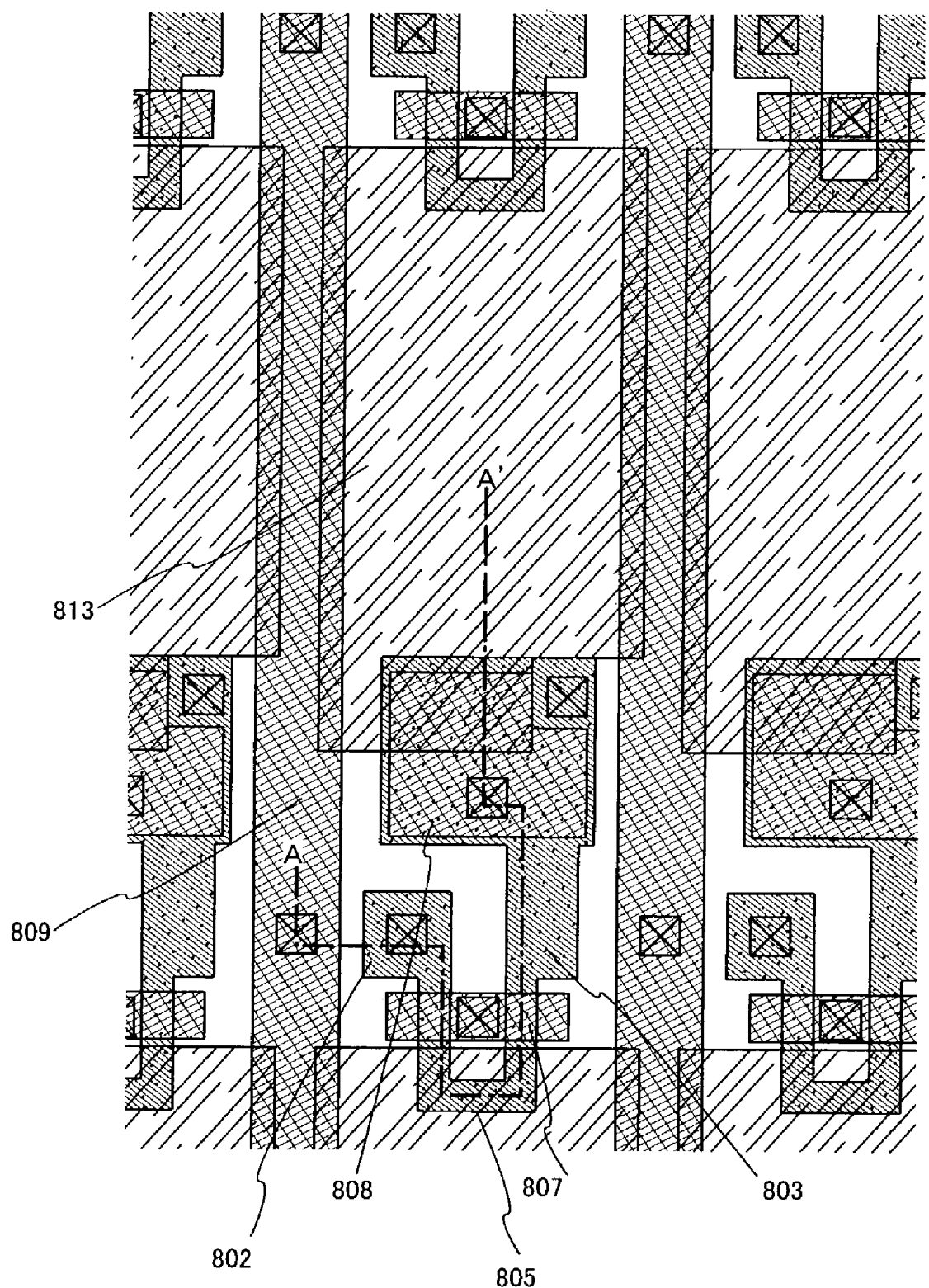
FIG. 9 is a view showing the manufacturing process for a liquid crystal display device of the invention.

Then, after removing the mask, a first insulating film 810 is formed covering the gate electrode 807, the capacitance interconnection 808 and interconnection (source line) 809. Herein, a silicon oxide film is formed in a film thickness of 50 nm, and a thermal process is carried out to activate the n-type or p-type impurity element added at respective concentrations in the semiconductor layer 805. Herein, thermal process is made at 850° C. for 30 minutes (FIG. 8A). Incidentally, a pixel top view herein is shown in FIG. 9. In FIG. 9, the sectional view taken along the dotted line A–A' corresponds to FIG. 8A.

Figure 8B:
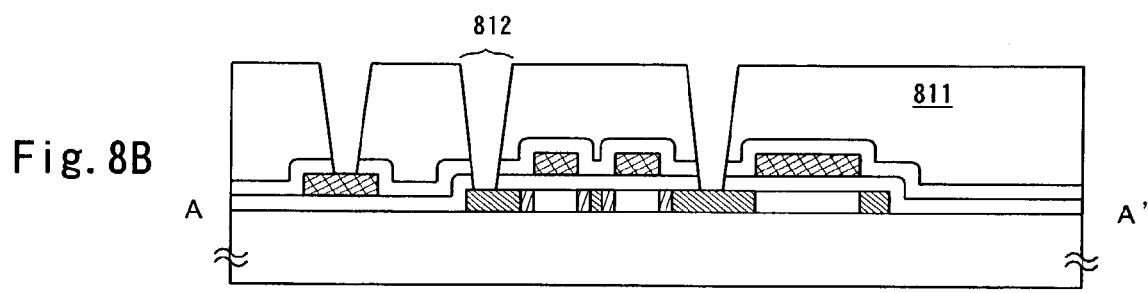

Then, after carrying out a hydrogenation process, a second insulating film 811 is formed of an organic resin material. By herein using an acryl film having a film thickness of 1 µm, the second insulating film 811 can be flattened in its surface. This prevents the affection of a step caused by the pattern formed in the layer beneath the second insulating film 811. Then, a mask is formed on the second insulating film 811, to form by etching a contact hole 812 reaching the semiconductor layer 805 (FIG. 8B). After forming the contact hole 812, the mask is removed away.

Figure 8C:
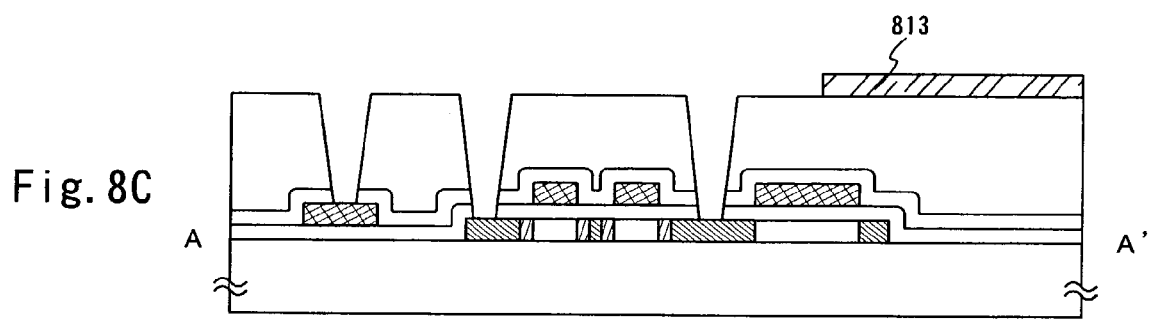

Next, a 120-nm transparent conductive film (herein, indium oxide-tin (ITO) film) is deposited by sputtering, and patterned into a rectangular form by the use of a photolithography technique. After carrying out a wet-etching treatment, heating treatment is made in a clean oven at 250° C. for 60 minutes thereby forming a transparent electrode 813 (FIG. 8C). The pixel top view herein is shown in FIG. 9. In FIG. 9, the sectional view taken along the dotted line A–A' corresponds to FIG. 8C.

Next, a second conductive film is formed and patterned. Due to this, formed are, besides a reflection electrode 814 formed on the transparent electrode 813, an interconnection 815 electrically connecting between the interconnection (source line) 809 and the source region of TFT 820, an interconnection 816 forming a contact with the drain region of TFT 820, and an interconnection 817 electrically connecting between the drain region of TFT 820 and the transparent electrode 813. The second conductive film formed herein is a reflective conductive film to form a reflection electrode of the invention, which can use aluminum or silver, or otherwise an alloy material based on these.

This example uses a layered film having a two-layer structure continuously formed, by a sputter method, with a Ti film having 50 nm as the second conductive film and a Si-contained aluminum film having 500 nm.

The method of patterning uses a photolithography technique to form a reflection electrode 814 comprising a plurality of island-like patterns and interconnections 815, 816, 817. The method for etching herein uses a dry etching scheme to carry out taper etching and anisotropic etching.

At first, a resist mask is formed to carry out a first etching process for taper etching. The first etching process is under first and second etching conditions. For etching, an ICP (Inductively Coupled Plasma) etching technique is suitably used. Using the ICP etching technique, the film can be etched to a desired taper form by properly controlling the etching condition (amount of power applied to a coil-formed electrode, amount of power applied to a substrate-sided electrode, electrode temperature close to the substrate, etc.). The etching gas can suitably use a chlorine-based gas represented by $Cl_2$, $BCl_3$, $SiCl_4$, $CCl_4$ or the like, a fluorine-based gas represented by $CF_4$, $SF_6$, $NF_3$ or the like, or $O_2$.

This example uses the ICP (Inductively Coupled Plasma) etching technique, as a first etching condition, wherein $BCl_3$, $Cl_2$ and $O_2$ are used for an etching gas. Etching is conducted with a plasma caused by feeding a 500 W RF (13.56 MHz) power to a coil-formed electrode at a flow rate ratio of these gasses of 65/10/5 (sccm) under a pressure of 1.2 Pa. A 300 W RF (13.56 MHz) power is fed also to the substrate side (sample stage) to apply substantially a negative self-bias voltage. Under the first etching condition, the Si-contained aluminum film is etched to make the first conductive layer at its end into a taper form.

Thereafter, the mask is not removed for change to the second etching condition. Using $CF_4$, $Cl_2$ and $O_2$ for an etching gas, etching is conducted for nearly 30 seconds with a plasma caused by feeding a 500 W RF (13.56 MHz) power to the coil-formed electrode at a flow rate ratio of these gasses of 25/25/10 (sccm) under a pressure of 1.2 Pa. A 20 W RF (13.56 MHz) power is fed also to the substrate side (sample stage) to apply substantially a negative self-bias voltage. Under the second etching condition having $CF_4$ and $Cl_2$ mixed together, the Si-contained aluminum film and the Ti film are both etched in the same degree.

In this manner, by the first etching process, the second conductive film comprising the first and second conductive layers can be made into a taper form.

Then, the resist mask is not removed to carry out a second etching process for anisotropic etching. Using herein $BCl_3$ and $Cl_2$ for an etching gas, etching is conducted with a plasma caused by feeding a 300 W RF (13.56 MHz) power to the coil-formed electrode at a flow rate ratio of these gasses of 80/20 (sccm) under a pressure of 1 Pa. A 50 W RF (13.56 MHz) power is fed also to the substrate side (sample stage) to apply substantially a negative self-bias voltage.

Figure 8D:
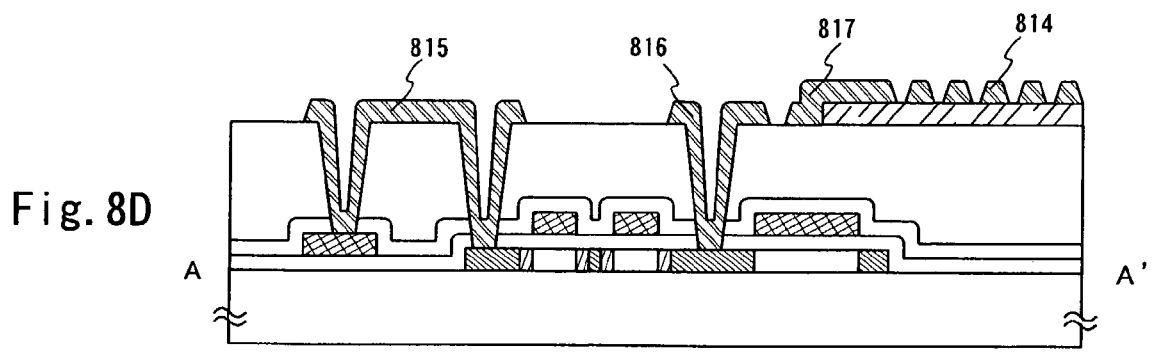
Figure 10:
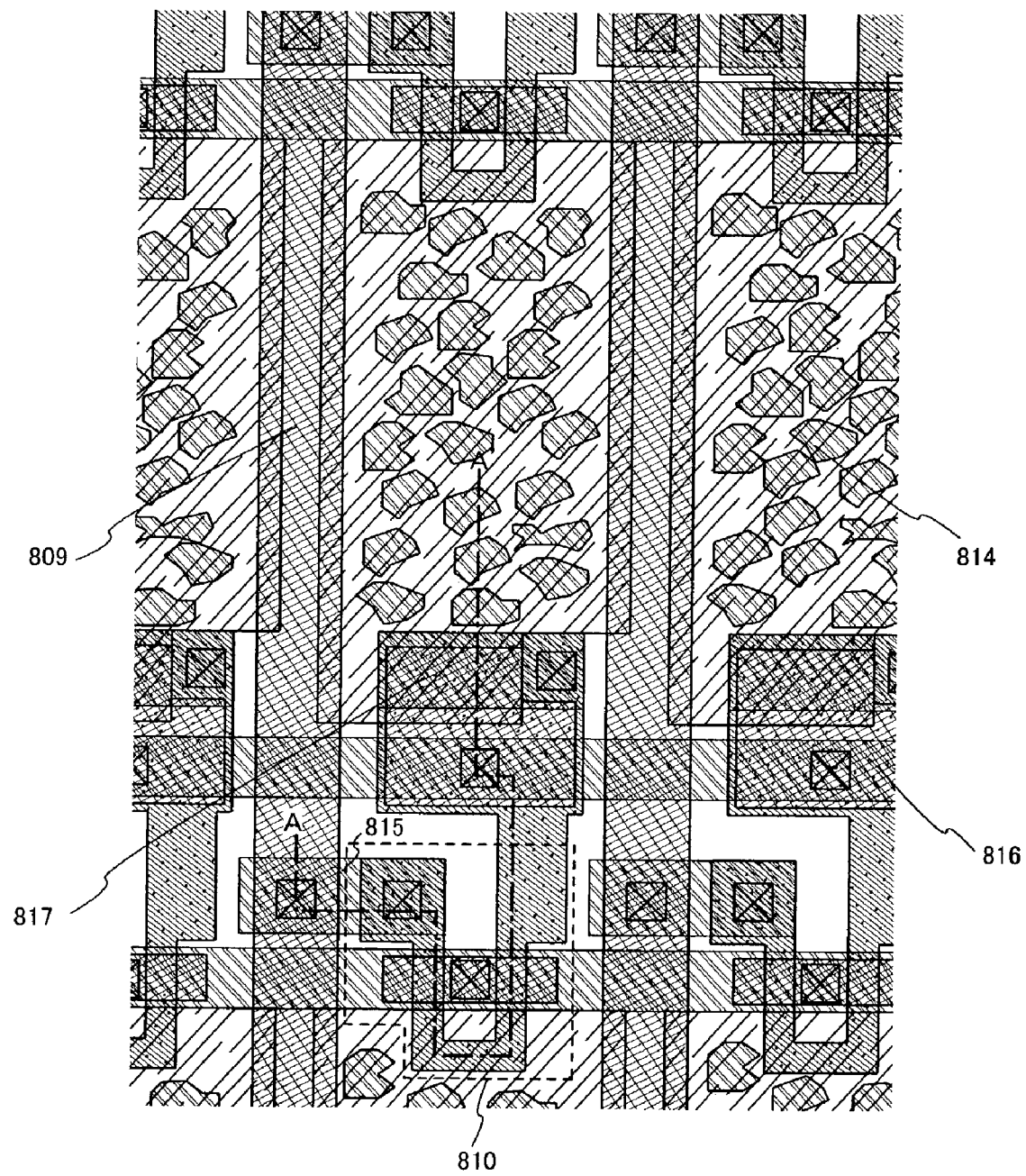
FIG. 10 is a view showing the manufacturing process for a liquid crystal display device of the invention.

By the above, at a time that a reflection electrode 814 and interconnections 815, 816 and 817 are formed, the resist is removed to obtain a structure shown in FIG. 8D. Incidentally, a pixel top view herein is shown in FIG. 10. In FIG. 10, the sectional view taken along the dotted line A–A' corresponds to FIG. 8D.

In the above manner, this example also forms an active matrix substrate having, on the same substrate, a pixel region having double-gate-structured n-channel TFTs and holding capacitances and a drive circuit having n-channel and p-channel TFTs.

Meanwhile, according to the process shown in this example, it is possible to simultaneously form a reflection electrode 814, and interconnections 815 816 and 817 by using a interconnection pattern mask as shown in FIG. 8D. Consequently, the reflection electrode can be formed separately in plurality in an island form on a transparent electrode without increasing the number of photo-masks required in fabricating an active matrix substrate. As a result, in the manufacture of a transflective liquid crystal display device, the process can be shortened thereby giving contribution to manufacture cost reduction and yield improvement.

Example 3

This example explains a method for manufacturing an active matrix substrate different in structure from the one showing in Examples 1 and 2.

Figure 12:
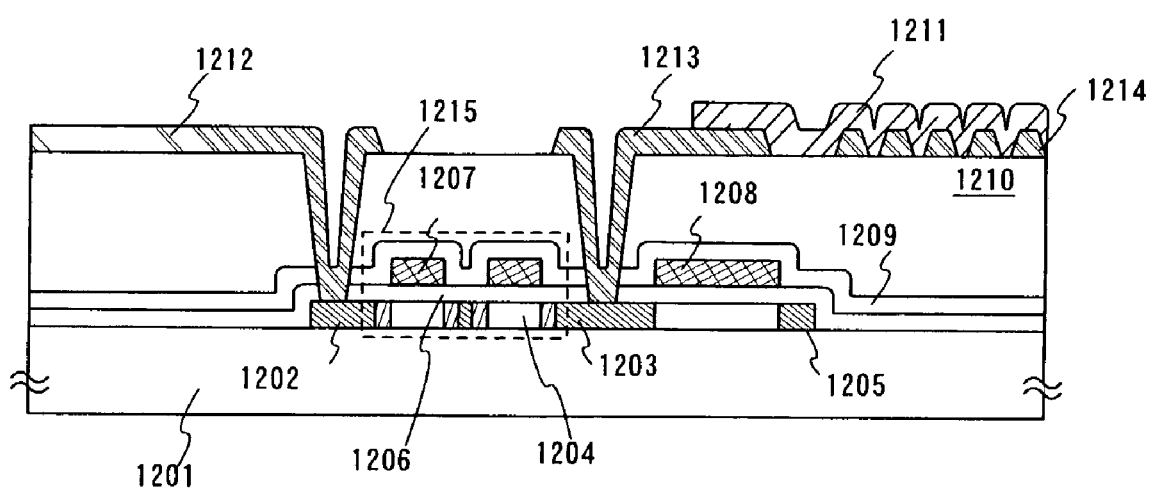
FIG. 12 is a view explaining a device structure of the liquid crystal display device of the invention.

In FIG. 12, over a substrate 1201 is formed a TFT 1215 having a gate electrode 1207, a source region 1202, a drain region 1203 and interconnections 1212 and 1213. The interconnections 1212 and 1213 are respectively, electrically connected to the source region and the drain region.

Incidentally, the active matrix substrate of this example is different from Examples 1 and 2 in that a transparent electrode 1211 is formed after forming the interconnections 1212 and 1213.

Similarly to the one showing in Example 1 or 2, a second insulating film 1210 is formed and, after a contact hole is formed therein, a second conductive film is formed. The material of the second conductive film used herein can use the same material as that of Example 1 or 2.

By patterning the second conductive film, it is possible to form interconnections 1212 and 1213 and a reflection electrode 1214. Incidentally, a reflection electrode 1214 having a plurality of island-like patterns can be formed by a method similar to the method for forming the reflection film formed in Example 1 or 2. However, because the reflection electrode 1214 of this example is formed separately in an island form on the second insulating film 1210, during formation it is not electrically connected to the TFT 1215. Thereafter, an electrical connection can be formed by forming the layer of a transparent conductive film 1211 on part of the interconnection 1213 and on the reflection electrode 1214.

Incidentally, the active-matrix substrate fabricated in this example can be manufactured as a liquid crystal display device by implementing the method shown in Example 4

According to the example, steps of fabricating a transflective type liquid crystal display device from the active matrix substrate fabricated by Example 1 will be explained as follows. A sectional view of FIG. 11 is used for explanation.

Figure 11:
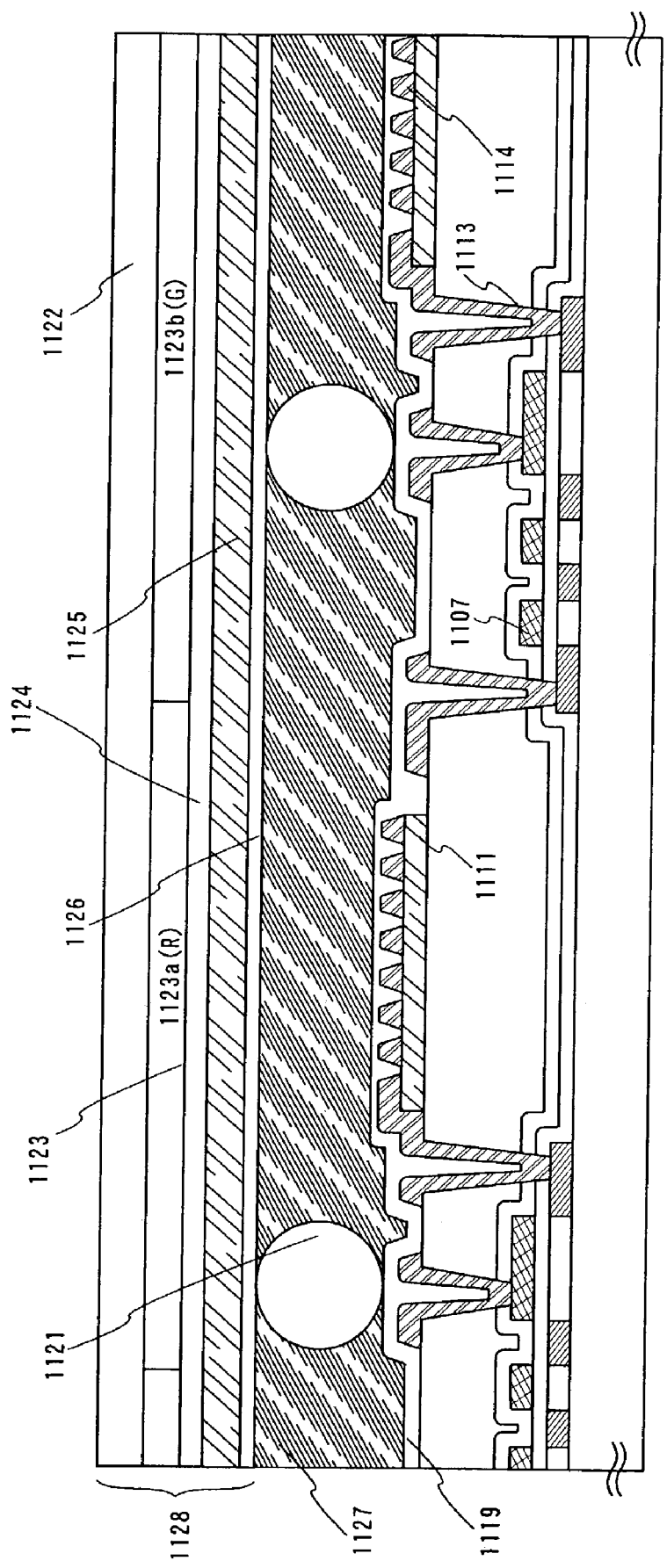
FIG. 11 is a view explaining a structure of a liquid crystal display device of the invention.

First, after obtaining the active matrix substrate of FIG. 3D in accordance with the example 1, as shown by FIG. 11, an alignment film 1119 is formed on the active matrix substrate and rubbing treatment is carried out. Further, according to the example, after forming the alignment film 1119, spherical spacers 1121 for holding an interval between the substrates are scattered over entire surfaces of the substrates. Further, in place of the spherical spacers 1121, column-like spacers may be formed at desired positions by patterning an organic resin film of an acrylic resin film or the like.

Next, a substrate 1122 is prepared. A coloring layer 1123 (1123a, 1123b) and a flattening layer 1124 are formed on the substrate 1122. Further, as the coloring layer 1123, a coloring layer 1123a of red color, a coloring layer 1123b of blue color and a coloring layer of green color (not illustrated) are formed. Further, although not illustrated here, a light blocking portion may be formed by partially overlapping the coloring layer 1123a of the red color and the coloring layer 1123b of the blue color or partially overlapping the coloring layer 1123a of the red color and the coloring layer of the green color (not illustrated).

Further, an opposed electrode 1125 comprising a transparent conductive film is formed on the flattening film 1124 at a position for constituting a pixel portion, an alignment film 1126 is formed over an entire face of the substrate 1122 and rubbing treatment is carried out to thereby provide an opposed substrate 1128.

Further, the active matrix substrate formed with the alignment film 1119 on the surface and the opposed substrate 1128 are pasted together by a seal agent (not illustrated). The seal agent is mixed with a filler and two sheets of the substrates are pasted together with a uniform interval (preferably, 2.0 through 3.0 μm) therebetween by the filler and the spherical spacers. Thereafter, a liquid crystal material 1127 is injected between the two substrates and completely sealed by a seal agent (not illustrated). A publicly known liquid crystal material may be used for the liquid crystal material 1127. In this way, the transflective type liquid crystal display device shown in FIG. 11 is finished. Further, as necessary, the active matrix substrate or the opposed substrate 1128 is divided to cut in a desired shape. Further, polarizers and the like are pertinently provided by using a publicly known technology. Further, FPC is pasted thereto by using the publicly known technology.

Figure 15:
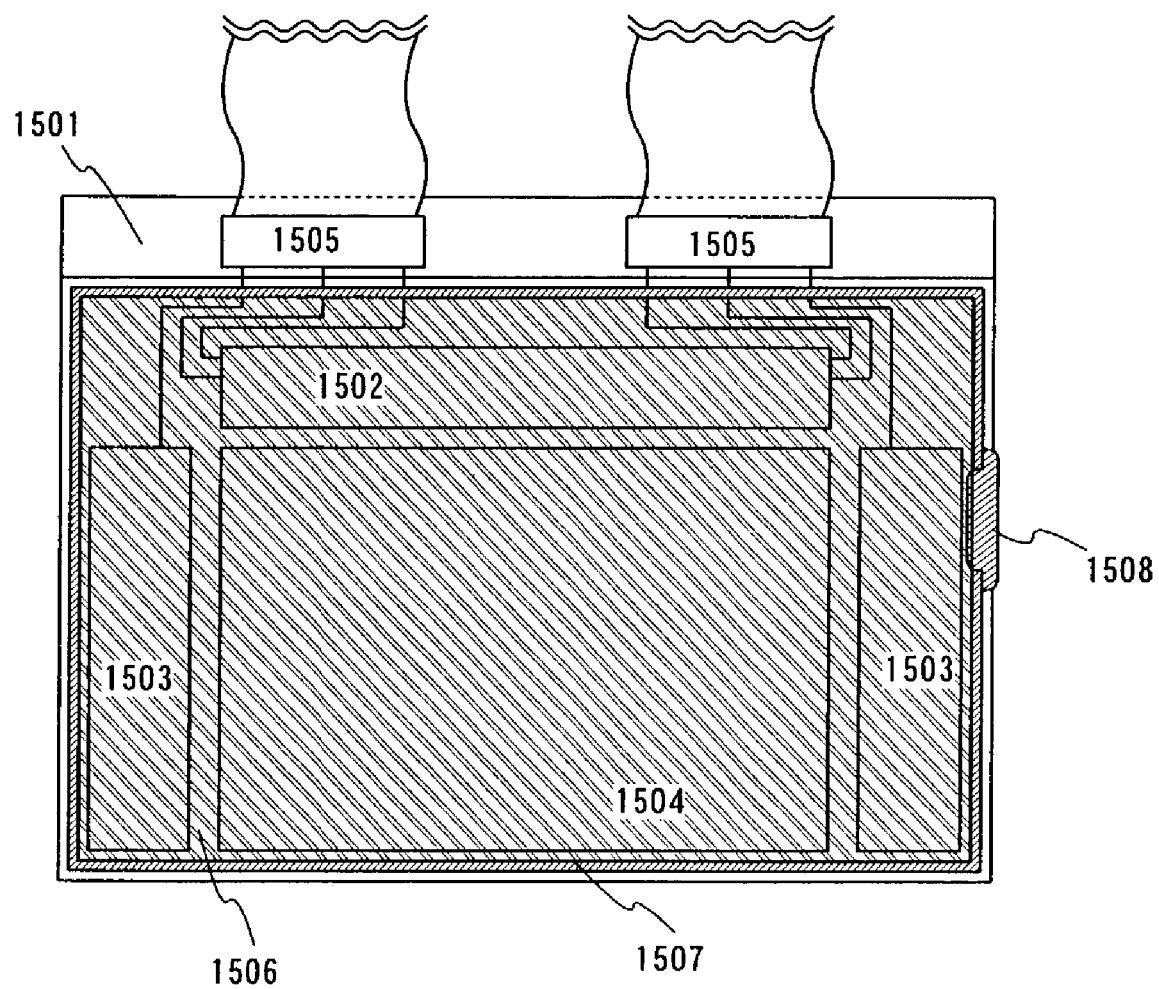
FIG. 15 is a view explaining an exterior appearance of the liquid crystal display device of the invention.

The constitution of the liquid crystal module provided in this way will be explained in reference to a top view of FIG. 15. A pixel portion 1504 is arranged at the center of an active matrix substrate 1501. A source signal line drive circuit 1502 for driving a source signal line is arranged on an upper side of the pixel portions 1504. Gate signal line drive circuits 1503 for driving gate signal lines are arranged on the left and on the right of the pixel portion 1504. Although according to an example shown by the example, the gate signal line drive circuits 1503 are symmetrically arranged on the left and on the right of the pixel portion, the gate signal line drive circuit 1503 may be arranged to only one side thereof and a designer may pertinently select the side in consideration of a substrate size of the liquid crystal module or the like. However, the left and right symmetric arrangement shown in FIG. 15 is preferable in consideration of operational reliability and drive efficiency of circuit.

Signals are inputted to respective drive circuits from flexible print circuits (FPC) 1505. According to FPC 1505, after opening contact holes at an interlayer insulating film and a resin film to reach a interconnection arranged at a predetermined location of the substrate 1501 and forming a connection electrode (not illustrated), FPC 1505 is pressed thereto via an anisotropic conductive film or the like. According to the example, the connection electrode is formed by using ITO.

At surroundings of the drive circuit and the pixel portion, a seal agent 1507 is coated along the outer periphery of the substrate and an opposed substrate 1506 is pasted in a state of maintaining a constant gap (interval between the substrate 1501 and the opposed substrate 1506) by spacers previously formed on the active matrix substrate. Thereafter, liquid crystal elements are injected from portions at which the seal agent 1507 is not coated and the substrates are hermetically sealed by a seal agent 1508. The liquid crystal module is finished by the above-described steps. Further, although an example of forming all the drive circuits on the substrates is shown here, several pieces of ICs may be used at portions of the drive circuit. Thereby, the active matrix type liquid crystal display device is finished.

Example 5

Figure 13:
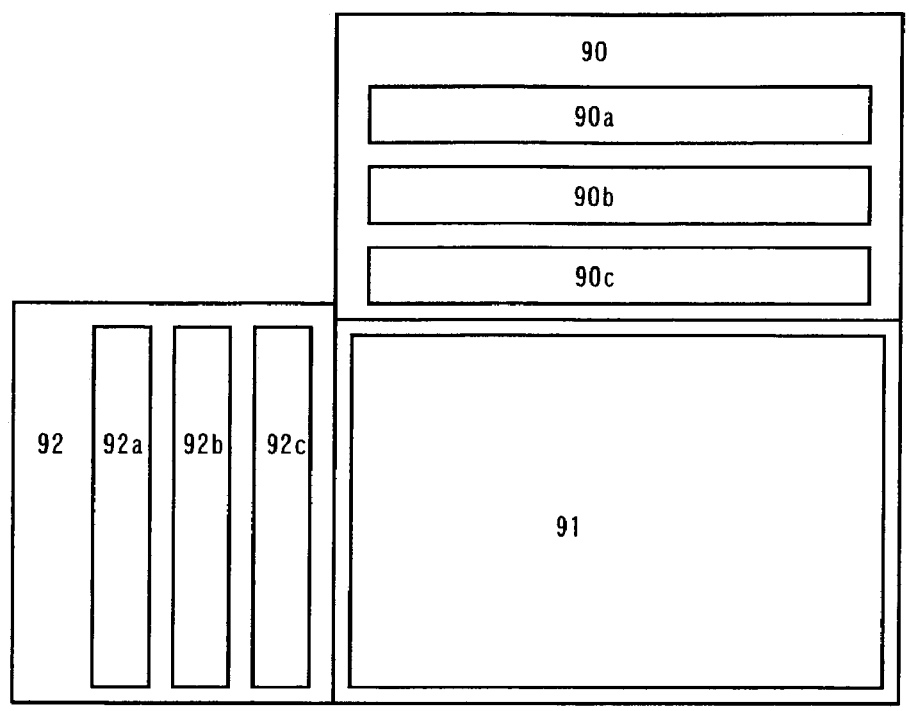
FIG. 13 is a diagram explaining a circuit configuration usable in the invention.
Figure 14:
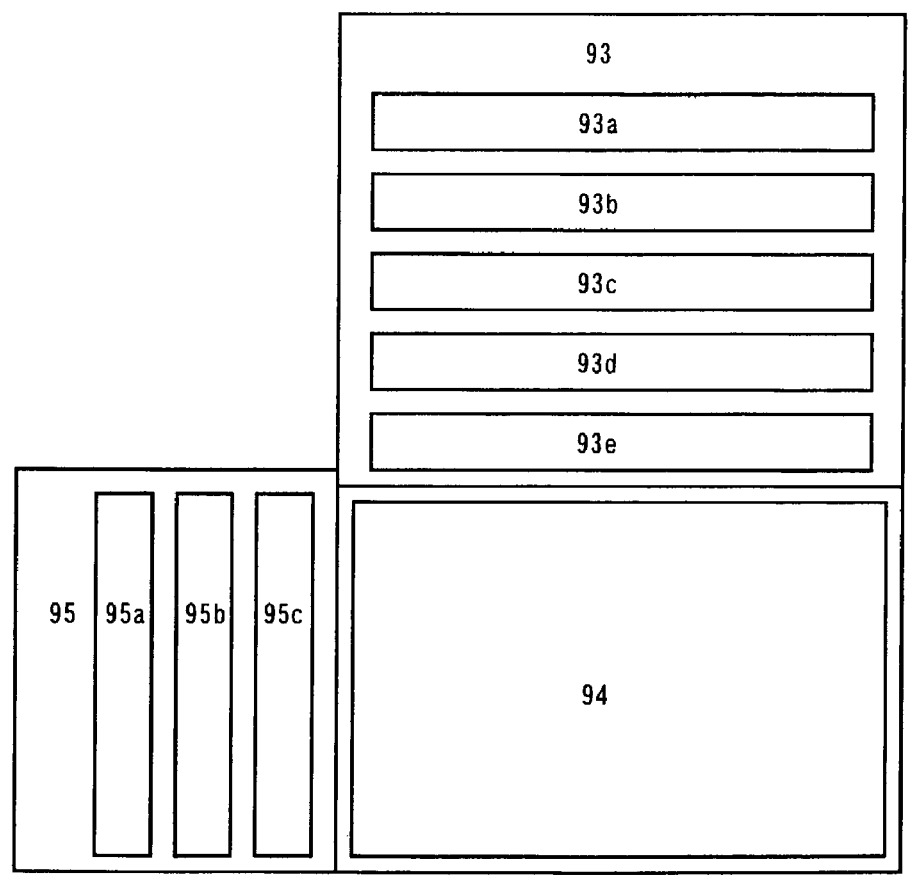
FIG. 14 is a diagram explaining a circuit configuration usable in the invention.

FIGS. 13 and 14 show block diagrams of an electro-optic device manufactured in accordance with the present invention. Note that FIG. 13 shows the structure of a circuit used for performing analog driving. This example describes an electro-optic device having a source side driver circuit 90, a pixel portion 91, and a gate side driver circuit 92. The term driver circuit herein collectively refers to a source side driver circuit and a gate side driver circuit.

The source side driver circuit 90 is provided with a shift register 90a, a buffer 90b, and a sampling circuit (transfer gate) 90c. The gate side driver circuit 92 is provided with a shift register 92a, a level shifter 92b, and a buffer 92c. If necessary, a level shifter circuit may be provided between the sampling circuit and the shift register.

In this example, the pixel portion 91 is composed of a plurality of pixels, and each of the plural pixels has TFT elements.

Though not shown in the drawing, another gate side driver circuit may be provided in across the pixel portion 91 from the gate side driver circuit 92.

When the device is digitally driven, the sampling circuit is replaced by a latch (A) 93b and a latch (B) 93c as shown in FIG. 14. A source side driver circuit 93 is provided with a shift register 93a, the latch (A) 93b, the latch (B) 93c, a D/A converter 93d, and a buffer 93e. A gate side driver circuit 95 is provided with a shift register 95a, a level shifter 95b, and a buffer 95c. If necessary, a level shifter circuit may be provided between the latch (B) 93c and the D/A converter 93d.

The above structure is obtained by employing the manufacture process of either Example 1 or 2. Although this example describes only the structure of the pixel portion and the driver circuit, a memory circuit and a microprocessor circuit can also be formed when following the manufacture process of the present invention.

Example 6

The transflective type liquid crystal display device fabricated by carrying out the invention can be used in various electro-optic devices. Further, the invention is applicable to all electronic apparatus integrated with the electro-optic devices as display media.

As electronic apparatus fabricated by using the liquid crystal display device fabricated according to the invention, there are pointed out a video camera, a digital camera, a navigation system, a voice reproducing device (car audio, audio component), a notebook type personal computer, a game machine, a portable information terminal (mobile computer, cellular phone, portable game machine or electronic book), device reproducing record media of image reproducing device having record media (specifically, digital video disk (DVD)) and having display devices capable of displaying the image. FIGS. 16A to 16F show specific examples of the electronic apparatus.

Figure 16A:
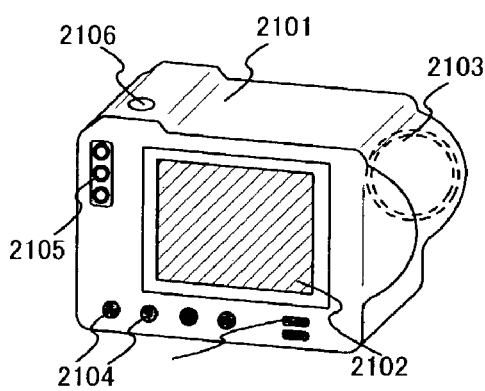
FIGS. 16A to 16F are views showing an example of electrical apparatus.

FIG. 16A is a digital still camera which includes a main body 2101, a display portion 2102, an image receiving portion 2103, an operation key 2104 and an outside connection port 2105 and a shutter 2106. The digital still camera is fabricated by using the liquid crystal display device fabricated by the invention at the display portion 2102.

Figure 16B:
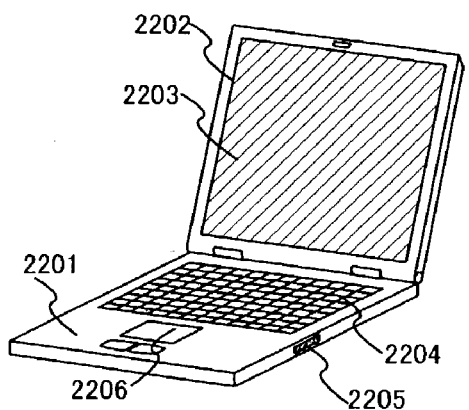

FIG. 16B is a notebook type personal computer which includes a main body 2201, a cabinet 2202, a display portion 2203, a keyboard 2204, an outside connection port 2205 and a pointing mouse 2206. The notebook type personal computer is fabricated by using the liquid crystal display device fabricated by the invention at the display portion 2203.

Figure 16C:
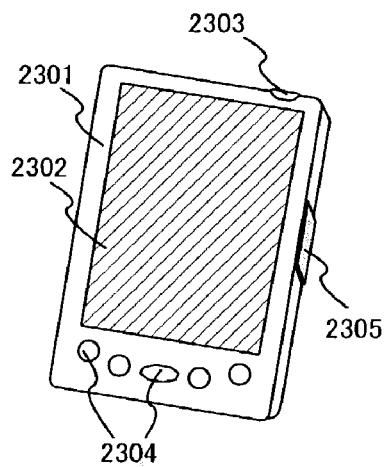

FIG. 16C shows a mobile computer which includes a main body 2301, a display portion 2302, a switch 2303, an operation key 2304 and an infrared ray port 2305. The mobile computer is fabricated by using the liquid crystal display device fabricated by the invention at the display portion 2302.

Figure 16D:
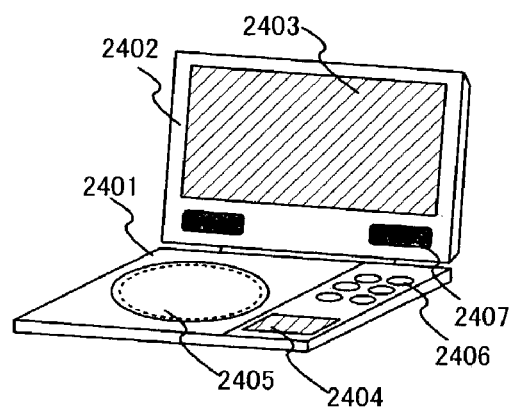

FIG. 16D shows a portable image reproducing device having a record medium (specifically, DVD reproducing device) which includes a main body 2401, a cabinet 2402, a display portion A 2403, a display portion B 2404, a record medium (DVD etc) reading portion 2405, an operation key 2406, and a speaker portion 2407. The display portion A 2403 mainly displays image information, the display portion B 2404 mainly displays character information and the portable image reproducing device is fabricated by using the liquid crystal display device fabricated by the invention at the display portions A, B 2403, 2404. Further, the image reproducing device having the record media includes a game machine for household use.

Figure 16E:
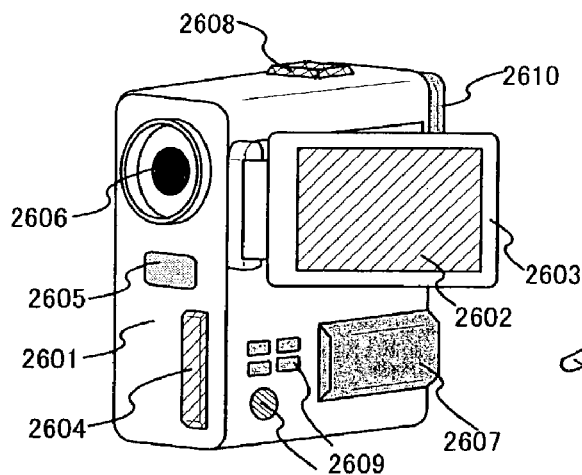

FIG. 16E shows a video camera which includes a main body 2601, a display portion 2602, a cabinet 2603, an outside connection port 2604, a remote control receiving portion 2605, an image receiving portion 2606, a battery 2607, a voice input portion 2608, an operation key 2609 and an eye-piece portion 2610. The video camera is fabricated by using the liquid crystal display device fabricated by the invention at the display portion 2602.

Figure 16F:
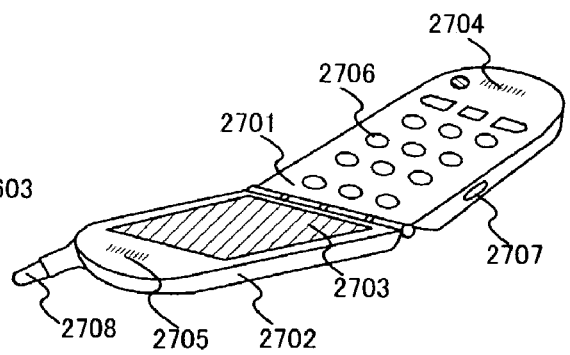

Here, FIG. 16F shows a cellular phone which includes a main body portion 2701, a cabinet 2702, a display portion 2703, a voice input portion 2704, a voice output portion 2705, an operation key 2706, an outside connection port 2707 and an antenna 2708. The cellular phone is fabricated by using the liquid display device fabricated by the invention at the display portion 2703. Further, the display portion 2703 can restrain power consumption of the cellular phone by displaying a character of white color on the background of black color.

As described above, the range of applying the liquid crystal display device fabricated according to the invention is extremely wide and electronic apparatus in all the fields can be fabricated. Further, the electronic apparatus of the embodiment can be made by using the liquid crystal display device fabricated by carrying out Example 1 through Example 5.

By the above, by carrying out the present invention, because the scatterbility of light can be enhanced by forming a concavo-convex structure with using a transparent electrode and reflection electrode in the manufacture of a transflective type liquid crystal display device, display visibility can be improved. Also, because a plurality of island-like patterns to be made into a reflection electrode can be formed simultaneously with interconnections by etching a conductive film, it is possible to realize a great cost reduction and improvement in productivity.

What is claimed is:

1. A liquid crystal display device comprising:
   a transparent conductive film formed on an insulating surface; and
   an interconnection and a plurality of island-like conductive films that are formed on the transparent conductive film,
   wherein the plurality of island-like conductive films are irregularly arranged on the transparent conductive film,
   wherein the transparent conductive film, the interconnection and the plurality of island-like conductive films are electrically connected, and
   wherein the plurality of island-like conductive films together have an area ratio of 50–90% of an area occupied by the transparent conductive film.

2. A liquid crystal display device according to claim 1, wherein the plurality of island-like conductive films each has a pattern end having a taper angle of 5–60 degrees.

3. A liquid crystal display device according to claim 1, wherein the transparent conductive film comprises at least one material selected from the group consisting of indium tin oxide, indium oxide and zinc oxide.

4. A liquid crystal display device according to claim 1, wherein the liquid crystal display device is incorporated into an electronic apparatus selected from the group consisting of a digital still camera, a notebook personal computer, a mobile computer, a portable type image reproducing apparatus having a recording medium, a video camera and a cellular phone.

5. A liquid crystal display device comprising:
   a transparent conductive film formed on an insulating surface; and
   an interconnection and a plurality of island-like conductive films that are simultaneously formed on the transparent conductive film,
   wherein the plurality of island-like conductive films are irregularly arranged on the transparent conductive film,
   wherein the transparent conductive film, the interconnection and the plurality of island-like conductive films are electrically connected, and
   wherein the plurality of island-like conductive films together have an area ratio of 50–90% of an area occupied by the transparent conductive film.

6. A liquid crystal display device according to claim 5, wherein the plurality of island-like conductive films each has a pattern end having a taper angle of 5–60 degrees.

7. A liquid crystal display device according to claim 5, wherein the transparent conductive film comprises at least one material selected from the group consisting of indium tin oxide, indium oxide and zinc oxide.

8. A liquid crystal display device according to claim 5, wherein the liquid crystal display device is incorporated into an electronic apparatus selected from the group consisting of a digital still camera, a notebook personal computer, a mobile computer, a portable type image reproducing apparatus having a recording medium, a video camera and a cellular phone.

9. A liquid crystal display device according to claim 1, wherein the transparent conductive film is a pixel electrode.

10. A liquid crystal display device according to claim 5, wherein the transparent conductive film is a pixel electrode.

11. A liquid crystal display device comprising:
   a transparent conductive film formed on an insulating surface; and
   a plurality of island-like conductive films formed on the transparent conductive film,
   wherein the plurality of island-like conductive films are irregularly arranged on the transparent conductive film, and
   wherein the plurality of island-like conductive films together have an area ratio of 50–90% of an area occupied by the transparent conductive film.

12. A liquid crystal display device according to claim 11, wherein the plurality of island-like conductive films each has a pattern end having a taper angle of 5–60 degrees.

13. A liquid crystal display device according to claim 11, wherein the transparent conductive film comprises at least one material selected from the group consisting of indium tin oxide, indium oxide and zinc oxide.

14. A liquid crystal display device according to claim 11, wherein the liquid crystal display device is incorporated into an electronic apparatus selected from the group consisting of a digital still camera, a notebook personal computer, a mobile computer, a portable type image reproducing apparatus having a recording medium, a video camera and a cellular phone.

* * * * *